(12) United States Patent
Hirano et al.

(10) Patent No.: US 6,831,858 B2
(45) Date of Patent: Dec. 14, 2004

(54) NON-VOLATILE SEMICONDUCTOR MEMORY DEVICE AND DATA WRITE CONTROL METHOD FOR THE SAME

(75) Inventors: Yasuaki Hirano, Tenri (JP); Shuichiro Kouchi, Tenri (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/637,923

(22) Filed: Aug. 8, 2003

(65) Prior Publication Data

US 2004/0032774 A1 Feb. 19, 2004

(30) Foreign Application Priority Data

Aug. 8, 2002 (JP) ........................................ 2002-230891

(51) Int. Cl.[7] .............................................. G11C 16/04
(52) U.S. Cl. ............................ 365/185.03; 365/185.18; 365/185.24
(58) Field of Search ........................ 365/185.03, 185.18, 365/185.24, 185.23

(56) References Cited

U.S. PATENT DOCUMENTS 6,496,418 B2 * 12/2002 Kawahara et al. ..... 365/185.24
6,556,475 B2 * 4/2003 Yamazaki et al. ..... 365/185.18
6,643,188 B2 * 11/2003 Tanaka et al. ......... 365/185.03

FOREIGN PATENT DOCUMENTS

JP 02-007297 1/1990
JP 09-320282 12/1997

* cited by examiner

*Primary Examiner*—Huan Hoang
(74) *Attorney, Agent, or Firm*—Morrison & Foerster LLP

(57) ABSTRACT

A non-volatile semiconductor memory device, is provided, which comprises a plurality of memory cells capable of electrically writing and erasing data and a voltage control section for controlling a control voltage to be applied to each of the plurality of row lines. The voltage control section comprises a storing section and a voltage output section. The storing section stores the value of the control voltage, which is calculated to permit a threshold voltage distribution to be within a predetermined range, in accordance with the threshold voltage distribution of the plurality of memory cells in each chip. The voltage output section outputs the control voltage having the value stored in the storing section to each of the plurality of row lines.

16 Claims, 21 Drawing Sheets

NON-VOLATILE SEMICONDUCTOR MEMORY DEVICE AND DATA WRITE CONTROL METHOD FOR THE SAME

BACKGROUND OF THE INVENTION

1. Field of the Invention

The present invention relates to a non-volatile semiconductor memory device comprising a plurality of memory cells and a method for controlling data writing to the non-volatile semiconductor memory device.

2. Description of the Related Art

ETOX (EPROM Thin Oxide, Intel's registered trademark) flash memory is the most commonly used non-volatile semiconductor memory device.

FIG. 16 shows a memory cell 1600 contained in an ETOX flash memory. The memory cell 1600 comprises a semiconductor substrate 160, a tunnel oxide film 163, a floating gate 164, an interlayer insulating film 165, and a control gate 166. In the semiconductor substrate 160, a source region 161 and a drain region 162 are formed with a distance therebetween. The tunnel oxide film 163, the floating gate 164, the interlayer insulating film 165, and the control gate 166 are laminated in this order over an end of the source region 161, an end of the drain region 162, and the semiconductor substrate 160 between the source region 161 and the drain region 162.

The principle of operation of an ETOX flash memory will be described below.

Table 1 shows conditions for voltages applied to a memory cell in the modes of data writing, data erasing, and data reading of an ETOX flash memory.

TABLE 1

|  | Control gate | Drain | Source | Substrate |
|---|---|---|---|---|
| Data write mode | 9 V | 5 V/0 V | 0 V | 0 V |
| Data erase mode | −9 V | Open | 6 V | 0 V |
| Data read mode | 5 V | 1 V | 0 V | 0 V |

In data write (program) mode, a data writing voltage Vpp (e.g., 9 V) is applied to the control gate 166. A reference voltage Vss (e.g., 0 V) is applied to the source region 161 and the semiconductor substrate 160. A voltage of 5 V is applied to the drain region 162. Note that a voltage of 0 V is applied to the drain region 162 of the memory cell 1600 when data writing is not performed.

A large current flows through the channel layer between the source region 161 and the drain region 162. In this case, hot electrons are generated in the drain region 162 having a higher potential and then are injected into the floating gate 164. As a result, the memory cell 1600 enters the data written state where the threshold voltage of the memory cell 1600 is increased.

FIG. 17 is a graph showing the distribution of the threshold voltages of memory cells contained in a two-value flash memory. In the graph, the horizontal axis represents the threshold voltage of a memory cell, while the vertical axis represents the number of memory cells.

Typically, when electrons are injected into the floating gate of a memory cell, the memory cell enters the data written (programmed) state. The data written (programmed) state is represented by Data "0". When electrons are removed from the floating gate of a memory cell, the memory enters the data erased state. The data erased state is represented by Data "1".

When the threshold voltage of a memory cell goes higher than or equal to a predetermined voltage value (e.g., 5 V), data writing (programming) is ended. When the threshold voltage of a memory cell goes lower than or equal to a predetermined voltage value (e.g., 3 V), data erasing is ended.

In data erase mode, a voltage Vnn (e.g., −9 V) is applied to the control gate 166 (Table 1) and a voltage Vpe (e.g., 6 V) is applied to the source region 161 (Table 1). Therefore, the drain region 162 is opened. As a result, electrons are removed from the floating gate 164 of the channel layer via the tunnel oxide film 163 in the source region 161, thereby reducing the threshold voltage of the memory cell 1600. The threshold voltage distribution of a memory cell in the data erase mode is the same as the threshold voltage distribution of a memory cell in the data erased state shown in FIG. 17.

In data erase mode, a BTBT (Band To Band Tunneling) current flows between the source region 161 and the semiconductor substrate 160. As the BTBT current is generated, hot holes and hot electrons are generated simultaneously. The hot electrons flow into the drain region 162. The hot holes are attracted by the tunnel oxide film 163 and trapped into the tunnel oxide film 163.

It is generally said that the phenomenon that hot holes are trapped by the tunnel oxide film 163 reduces the reliability of data holding in a memory cell.

In data read mode, a voltage of 1 V is applied to the drain region 162 (Table 1). A voltage of 5 V is applied to the control gate 166 (Table 1).

When a memory cell is in the data erased state (the threshold voltage is low), a current flows through the memory cell, so that the state of the memory cell is determined to be Data "1" (FIG. 17). When a memory cell is in the data written (programmed) state (the threshold voltage is high), no current flows through the memory cell, so that the state of the memory cell is determined to be Data "0" (FIG. 17).

A flash memory comprises a sense amplifier circuit. The sense amplifier circuit detects a current flowing through a memory cell, from which data is read, and a current flowing through a reference cell and compares the values of these currents to determine whether the memory cell is in the data erased state (the threshold voltage is low) or in the data written (programmed) state. The reference cell has a predetermined reference threshold voltage.

A method for determining data read from a memory cell using a sense amplifier circuit will be described.

FIG. 18 shows the configuration of a sense amplifier circuit. The sense amplifier circuit comprises an amplifier 181. The amplifier 181 comprises a positive input terminal and a negative input terminal.

The positive input terminal of the amplifier 181 is connected to the drain terminal of an NMOS transistor 184. The source terminal of the NMOS transistor 184 is connected to the drain terminal of the reference cell 186. An inverter 182 is provided between the gate terminal and source terminal of the NMOS transistor 184. The gate terminal of the NMOS transistor 184 is connected to the output terminal of the inverter 182. The input terminal of the inverter 182 is connected to the source terminal of the NMOS transistor 184. The gate terminal of the reference cell 186 is connected to a word line. A word line voltage VWL is applied to the word line. The source terminal of the reference cell 186 is connected to the earth (GND).

The negative input terminal of the amplifier 181 is connected to the drain terminal of the NMOS transistor 185. The source terminal of the NMOS transistor 185 is connected to the drain terminal of a memory cell 187 contained in a main array. An inverter 183 is provided between the gate terminal and source terminal of the NMOS transistor 185. The gate terminal of the NMOS transistor 185 is connected to the output terminal of the inverter 183. The input terminal of the inverter 183 is connected to the source terminal of the NMOS transistor 185. The gate terminal of the memory cell 187 is connected to a word line. A word line voltage VWL is applied to the word line. The source terminal of the memory cell 187 is connected to the earth (GND).

Typically, when data is read from the memory cell 187 contained in a flash memory, the sense amplifier circuit compares a current Im flowing through the memory cell 187 and a current Ir flowing through the reference cell 186 to determine whether the state of the memory cell 187 is Data "0" or Data "1" (FIG. 18).

When the current Im flowing through the memory cell 187 is greater than the current Ir flowing through the reference cell 186 (Im>Ir), the sense amplifier circuit determines that the state of the memory cell 187 is Data "1" representing the data erased state. When the current Im flowing through the memory cell 187 is smaller than the current Ir flowing through the reference cell 186 (Im<Ir), the sense amplifier circuit determines that the state of the memory cell 187 is Data "0" representing the data written state.

In the case where the sense amplifier circuit is used to compare the current Im flowing through the memory cell 187 and the current Ir flowing through the reference cell 186 and determines whether the state of the memory cell 187 is Data "0" or Data "1", the threshold voltage of the reference cell 186 needs to be set between the threshold voltage (5 V or more) of a memory cell in which data is written and the threshold voltage (3 V or less) of a memory cell in which data is erased as shown in FIG. 16, for example. For example, the threshold voltage of the reference cell 186 is 3.5 V indicated by Read reference in FIG. 16.

The threshold voltage of the reference cell 186 needs to be a precise value if considering the data reading rate, the reliability of data holding, and the like. Therefore, the threshold voltage of the reference cell 186 should be determined to be 3.5 V with a precision of ±0.1 V. The word line voltage VWL and the word line voltage VRWL having the same value (e.g., 5 V) need to be precisely applied to the word lines connected to the gate terminal of the memory cell 187 and the gate terminal of the reference cell 186, respectively (FIG. 18).

FIG. 19 shows a memory block comprising a plurality of memory cells 187.

In the memory block, a plurality of memory cells 187 are arranged in a matrix, m control gate terminals are connected to each of word lines WL0 to WLn-1 arranged in the row direction. The control gate terminal is the control terminal of the memory cell 187, n drain terminals are connected to each of bit lines BL0 to BLm-1 arranged in the column direction. The drain terminal is the drive terminal of the memory cell 187. The source terminals of the plurality of memory cells 187 contained in the same memory block are connected to the common source line SL.

To achieve data writing (programming) to a memory cell, it is necessary to consistently control a current flowing through the memory cell and a voltage applied to the memory cell. Japanese Laid-Open Publication Nos. 9-320282 and 2-7297 disclose a data writing (programming) operation in which a current and a voltage are consistently controlled.

Generally, in the case of data writing (programming) to a memory cell of a flash memory, a single pulse of data writing (programming) voltage is applied to the memory cell to write data to the memory. However, considering the data writing (programming) rate, a single pulse of data writing (programming) voltage needs to be high (e.g., 5 V or more).

FIG. 20 is a graph showing the distribution of the threshold voltages (Vt) of memory cells in which data has been written. In the graph, the horizontal axis represents the threshold voltage of a memory cell, while the vertical axis represents the number of memory cells.

The threshold voltages Vt of memory cells in which data has been written (e.g., by applying a single pulse of data writing voltage) are distributed within a predetermined width of from the lowest threshold voltage Vtmin to the highest threshold voltage Vtmax. Therefore, a data writing voltage, which is applied via a word line to the control gate of a memory cell, is set so that the lowest value (Vtmin) of the threshold voltages of memory cells in which data has been written is greater than or equal to a predetermined value (e.g., 5 V).

To write data into memory cells of a conventional flash memory, a common voltage is set for all chips (devices) on a wafer. It is known that the distribution of the threshold voltages of a plurality of memory cells contained in flash memories usually vary from chip to chip. The electrical characteristics of memory cells vary depending on process conditions.

FIG. 21 is a graph showing an exemplary distribution of the threshold voltages of memory cells in each chip where data has been written under the same data writing (programming) conditions. In the graph, the horizontal axis represents the threshold voltage of a memory cell, while the vertical axis represents the number of memory cells.

The term "data is written under the same data writing (programming) conditions" means, for example, that data is written by applying a single pulse of data writing voltage.

In the case of a fast chip having a high data writing rate, the distribution of the threshold voltages of memory cells is shifted from the reference threshold voltage (5 V) to a higher voltage region. The distribution of the threshold voltages of memory cells is located at a sufficient distance from the reference threshold voltage (5 V).

In the case of a slow chip having a low data writing rate, the distribution of the threshold voltages of memory cells is located near the reference threshold voltage (5 V).

In the case of a typical chip having a normal data writing rate, the distribution of the threshold voltages of memory cells overlaps the distributions of the threshold voltages of memory cells of fast and slow chips.

When a single pulse of data writing (programming) voltage is applied to memory cells, a voltage applied to the control gate varies between memory cells due to variations in the electrical characteristics of memory cells or variations in the drive performance of transistors around a memory array (e.g., a word line drive circuit). Therefore, the distribution of the threshold voltage of a memory cell varies between chips to a further extent.

Therefore, a large variation in the distributions of the threshold voltages of memory cells between chips leads to a reduction in the reliability of memory cells. The reason will be described in detail.

Firstly, when data is written into memory cells in a fast chip, the threshold voltages of the memory cells after data writing (programming) vary (e.g., when the lowest threshold voltage is 6.0 V or more, the highest threshold voltage is 7 V or more). Referring back to FIG. 16, when a large, negative voltage is applied to the control gate 166 of a memory cell so as to erase data from the memory cell, extra electrons accumulate in the floating gate 164, so that the floating gate 164 is largely negatively charged. Therefore, an electric field generated between the semiconductor substrate 160 and the floating gate 164 exerts extra stress on the tunnel oxide film 163. As a result, the reliability of the memory cell is reduced.

Secondly, when data is written into memory cells of a slow chip, although the threshold voltages of the memory cells after data writing (programming) vary (e.g., the lowest threshold voltage Vtmin is about 5.0 V), the stress exerted on the tunnel oxide film 163 of the memory cell is small. However, when data erasing and data writing are alternately repeated, the distribution of the threshold voltages of memory cells is shifted toward a lower voltage region. This is because the data writing performance of some memory cells deteriorates (FIG. 22). For example, when a single pulse of data writing voltage is applied to a memory cell having a deteriorated data writing performance, the threshold voltage may be smaller than or equal to the reference threshold voltage (5 V). As a result, the memory cell reliability is reduced.

FIG. 22 is a graph showing an example in which the distribution of the threshold voltages of memory cells is shifted toward a lower voltage region. In the graph, the horizontal axis represents the threshold voltage of a memory cell, while the vertical axis represents the number of memory cells. Note that "E/W" indicates that data erasing and data writing are alternately repeated.

Particularly, even when a single pulse of data writing voltage is applied to a memory cell having a deteriorated data writing performance, the threshold voltage of the memory cell no longer goes higher than or equal to the reference threshold voltage (5 V). Therefore, a greater number of data writing pulses need to be applied to such a memory cell. As a result, the data writing rate is reduced.

SUMMARY OF THE INVENTION

According to an aspect of the present invention, a non-volatile semiconductor memory device is provided, which comprises: a plurality of memory cells capable of electrically writing and erasing data, the plurality of memory cells being arranged in a row direction and in a column direction, a control terminal of each of the plurality of memory cells being connected to one of a plurality of row lines provided in the row direction, and a drive terminal of each of the plurality of memory cells being connected to one of a plurality of column lines provided in the column direction; and a voltage control section for controlling a control voltage to be applied to each of the plurality of row lines. The voltage control section comprises a storing section and a voltage output section. The storing section stores the value of the control voltage, which is calculated to permit a threshold voltage distribution to be within a predetermined range, in accordance with the threshold voltage distribution of the plurality of memory cells in each chip. The voltage output section outputs the control voltage having the value stored in the storing section to each of the plurality of row lines.

In one embodiment of this invention, each of the plurality of memory cells is a floating gate field effect transistor.

In one embodiment of this invention, each of the plurality of memory cells is capable of writing a plurality of different data values, which constitute multi-value information.

In one embodiment of this invention, the voltage output section comprises a voltage selection section. The voltage selection section selects the control voltage based on the values of the control voltage stored in the storing section.

In one embodiment of this invention, the values of the control voltage stored in the storing section are obtained based on a difference between a reference threshold voltage and at least one of the highest and lowest values of the threshold voltages extracted based on the threshold voltage distribution.

In one embodiment of this invention, if predetermined information having a threshold voltage less than the highest reference threshold voltage of the reference threshold voltages of the multi-value information is written, the value of the control voltage stored in the storing section is obtained based on a difference between the highest threshold voltage value extracted based on the threshold voltage distribution after the predetermined information has been written and the reference threshold voltage corresponding to the predetermined information.

In one embodiment of this invention, if information having a threshold voltage equal to the highest reference threshold voltage of the reference threshold voltages of the multi-value information is written, the value of the control voltage stored in the storing section is obtained based on a difference between the highest and lowest threshold voltage values extracted based on the threshold voltage distribution after the predetermined information has been written.

In one embodiment of this invention, the value of the control voltage stored in the storing section contains a correction value obtained by considering variations in threshold voltage distribution from block to block contained in the chip.

In one embodiment of this invention, the value of the control voltage stored in the storing section contains a correction value obtained by considering variations in threshold voltage distribution between blocks contained in the chip.

In one embodiment of this invention, the value of the control voltage stored in the storing section contains a correction value obtained by considering variations in the threshold voltage distribution between blocks contained in the chip.

In one embodiment of this invention, the correction value further contains a value indicating a shift amount of the threshold voltage distribution after data writing and data erasing have been repeated alternately.

In one embodiment of this invention, the correction value further contains a value indicating a shift amount of the threshold voltage distribution after data writing and data erasing have been repeated alternately.

In one embodiment of this invention, the correction value further contains a value indicating a shift amount of the threshold voltage distribution after data writing and data erasing have been repeated alternately.

In one embodiment of this invention, the threshold voltage distribution of the plurality of memory cell in each chip is measured by a wafer test.

In one embodiment of this invention, in the wafer test, a single pulse of data writing voltage is applied to the plurality of memory cells.

According to another aspect of the present invention, a data writing control method is provided, which comprises the steps of: applying a single pulse of data writing voltage to a plurality of memory cells contained in a chip; extracting at least one of the highest and lowest threshold voltages based on a threshold voltage distribution of the plurality of memory cells; and calculating a control voltage to be applied to a control terminal of the memory cell, which permits the threshold voltage distribution to be within a predetermined range, based on at least one of the highest and lowest threshold voltages.

Hereinafter, functions of the present invention will be described.

The non-volatile semiconductor memory device of the present invention comprises a voltage output section on each chip. The non-volatile semiconductor memory device is subjected to a data writing test (wafer test) on a wafer on which the chip is formed. According to the result of the test, a data writing voltage to be applied to the control gate terminal of a memory cell is optimally set on a chip-by-chip basis.

Specifically, in the data writing test, one data writing pulse voltage is applied to memory cells in each chip (one pulse). After data writing, the highest value (Vtmax) of the threshold value and the lowest value (Vtmin) of the threshold value are extracted based on the threshold voltage distribution of the memory cells. An optimal voltage value to be applied to the control gate of a memory cell in each chip is calculated based on the maximum threshold voltage or the minimum threshold voltage. The optimal voltage value is stored as stored data in the storing circuit.

Therefore, in accordance with the stored data, the control signal WLVS is input to the voltage output section. A control signal H corresponding to the control signal WLVS is selected by the voltage output section. A data writing pulse voltage (predetermined information) to be applied to the control gate of a memory cell in each chip is set and output in accordance with the selected control signal H.

Thus, the invention described herein makes possible the advantages of providing: a non-volatile semiconductor memory device which controls the distribution of the threshold voltages (Vt) of memory cells having written data on a chip-by-chip (device-by-device) basis, thereby preventing a reduction in the reliability of data holding and a reduction in the data writing rate; and a control method for controlling data writing to the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
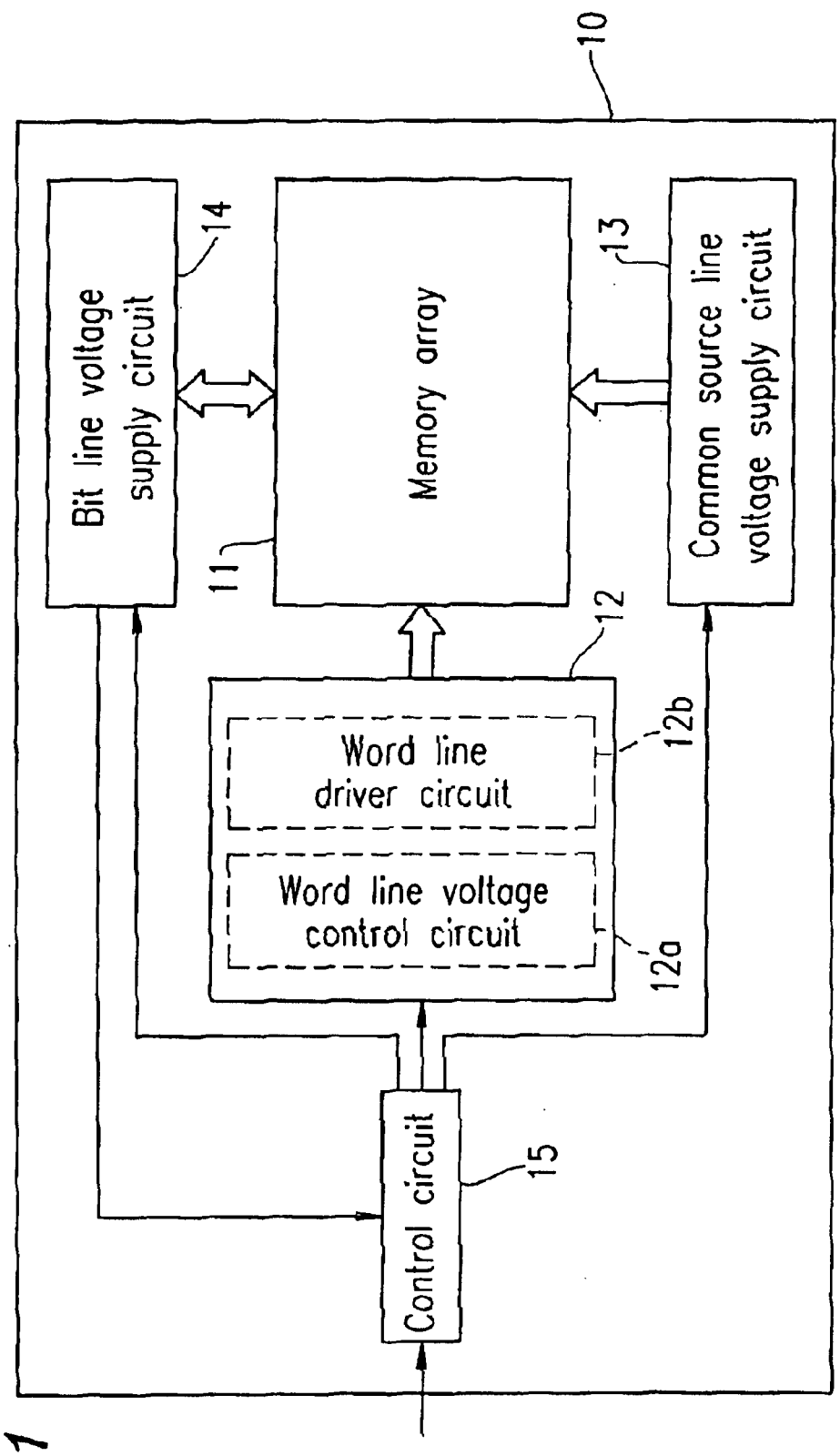
FIG. 1 shows a flash memory (chip) which is an exemplary non-volatile semiconductor memory device according to an embodiment of the present invention.

FIG. 1 shows a flash memory (chip) which is an exemplary non-volatile semiconductor memory device according to an embodiment of the present invention.

Figure 16:
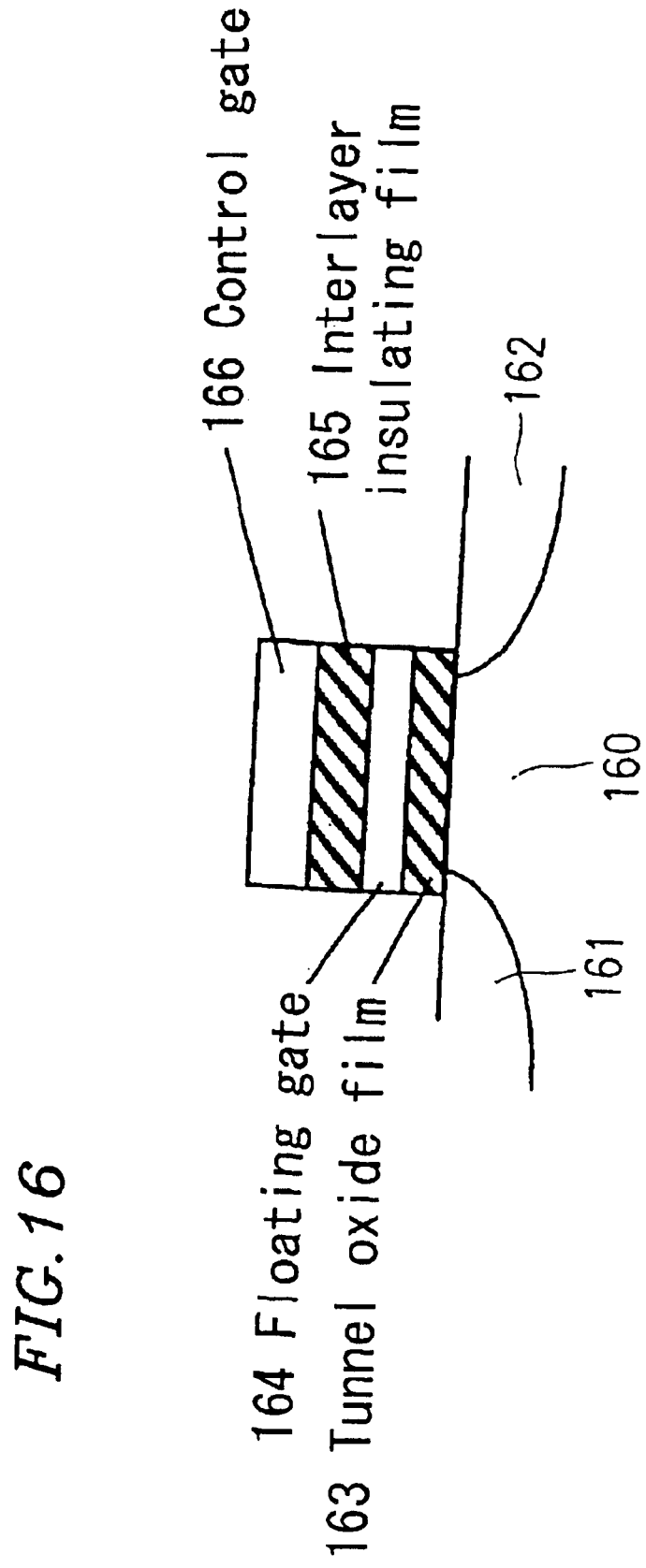
FIG. 16 shows a memory cell contained in an ETOX flash memory.
Figure 17:
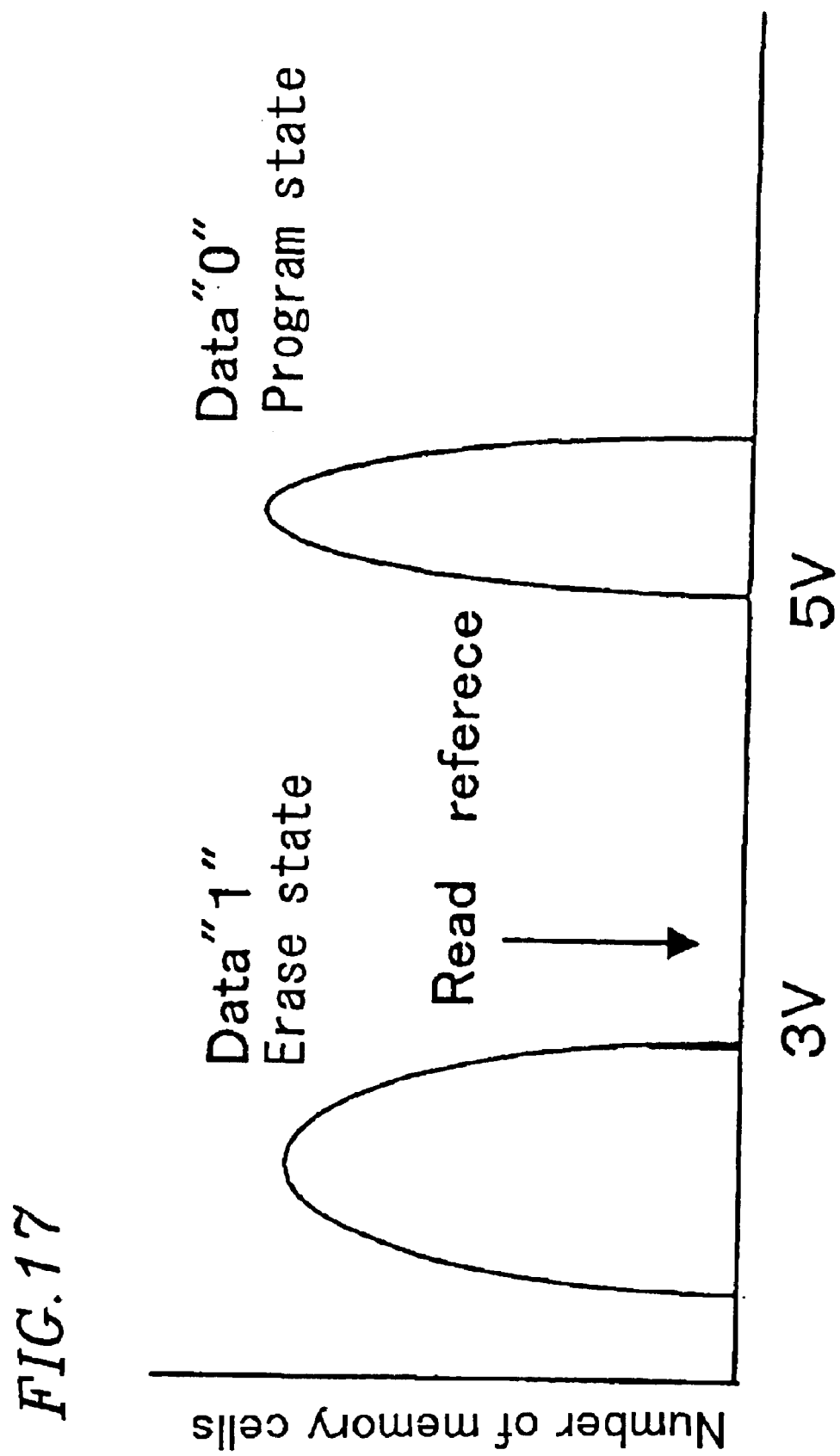
FIG. 17 shows a graph indicating the distribution of the threshold voltages of memory cells contained in a two-value flash memory.

A flash memory 10 comprises a memory cell array 11 comprising a plurality of memory cells. Each memory cell in the memory cell array 11 has the same configuration as that of the memory cell 1600 (FIG. 16). The memory cell comprises a floating gate field effect transistor.

The memory cell array 11 comprises a data storage region for storing data and a reference cell. After a signal pulse is applied to the memory cell for data writing or data erasing, the reference cell is compared with a main memory cell to verify whether or not the threshold voltage of each memory cell has reached a predetermined threshold voltage after applying a signal pulse into memory cells for data writing and data erasing. This operation is referred to as verification. Note that the reference cell is not shown in FIG. 1.

Figure 19:
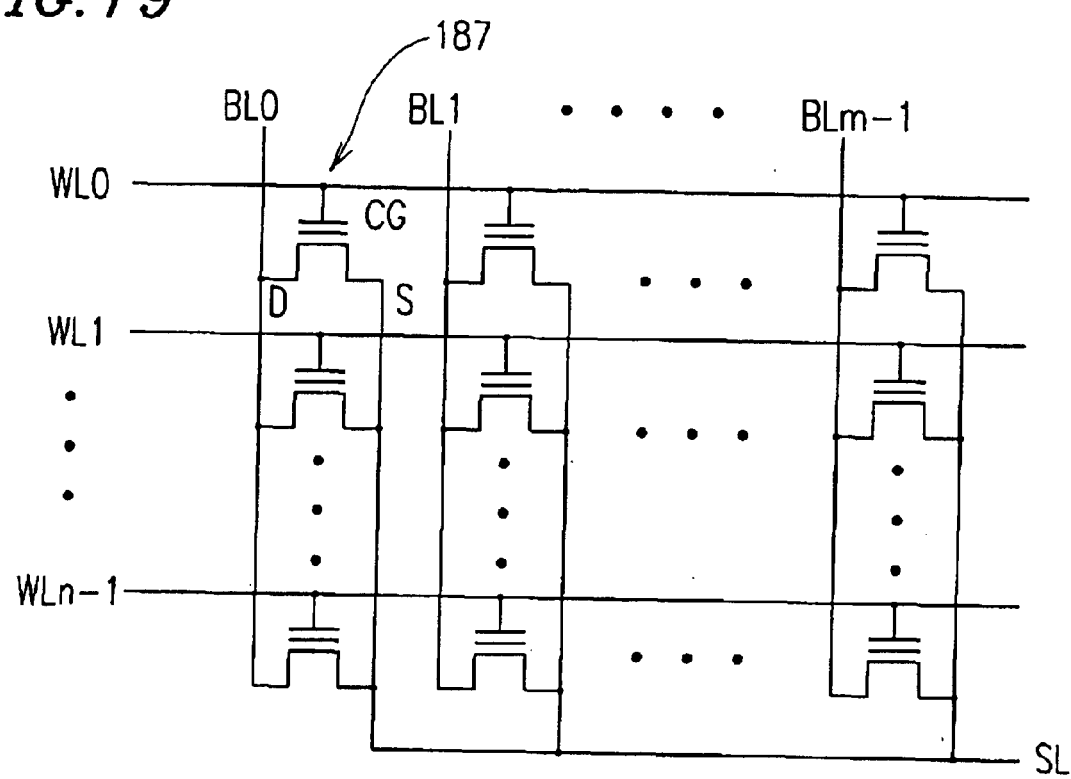
FIG. 19 shows one of memory blocks containing a plurality of memory cells.
Figure 20:
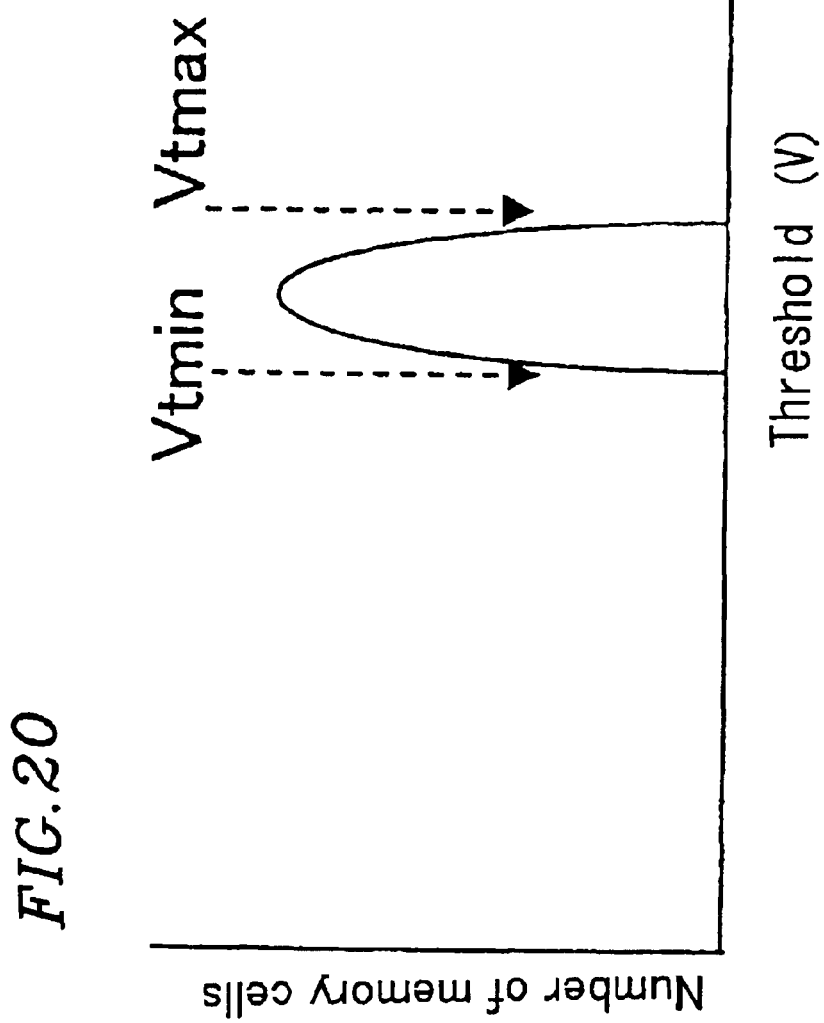
FIG. 20 shows a graph indicating the distribution of the threshold voltages (Vt) of memory cells in which data has been written.
Figure 21:
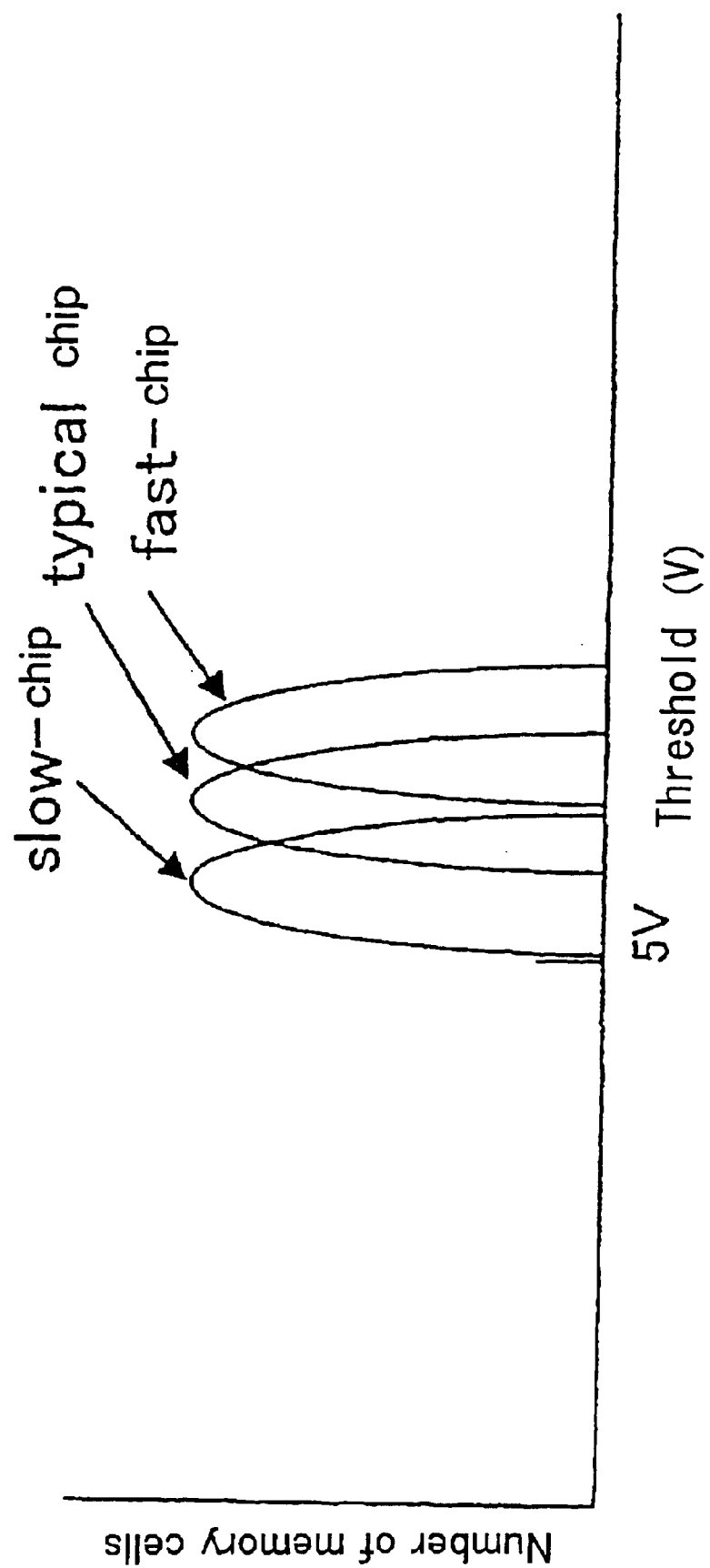
FIG. 21 shows a graph indicating an exemplary distribution of the threshold voltages of memory cells in each chip where data has been written under the same data writing (programming) conditions.

The memory cell array 11 is connected to a word line voltage supply circuit 12 for supplying a voltage to each of word lines WL0 to WLn-1, a common source line voltage supply circuit 13 for supplying a voltage to a common source line SL, and a bit line voltage supply circuit 14 for supplying a voltage to each of bit lines BL0 to BLm-1 (see FIG. 19).

The word line voltage supply circuit 12, the common source line voltage supply circuit 13, and the bit line voltage supply circuit 14 are controlled by the control circuit 15.

The word line voltage supply circuit 12 selects word lines WL0 to WLn-1 connected to the memory cell array 11 in accordance with a control signal and an address signal output by the control circuit 15. The word line voltage supply circuit 12 increases the voltage of a data writing control signal to a data writing (programming) voltage, which is in turn applied to each of the word lines WL0 to WLn-1 to drive the word lines WL0 to WLn-1.

The common source line voltage supply circuit 13 selects a common source line SL in accordance with a control signal and an address signal output by the control circuit 15. The common source line voltage supply circuit 13 increases the voltage of a data erasing control signal to a data erasing voltage, which is in turn applied to the common source line SL to drive the common source line SL. The common source line SL is connected to the source of each memory cell contained in the same block. Note that the memory cells of the memory cell array 11 are divided into blocks.

The bit line voltage supply circuit 14 selects bit lines BL0 to BLm-1 connected to the memory cell array 11 in accordance with a control signal and an address signal output by the control circuit 15. The bit line voltage supply circuit 14 increases the voltage of a data writing/data reading control signal, which is in turn applied to the bit lines BL0 to BLm-1 to drive the bit lines BL0 to BLm-1.

Note that the bit line voltage supply circuit 14 comprises a comparator circuit and a sense amplifier circuit. The comparator circuit compares a current flowing through a memory cell with a current flowing through a reference cell so as to verify a threshold voltage set in the memory cell and a threshold voltage set in the reference cell. The verification is carried out during data writing and data erasing. The comparator circuit further transfers a signal, which indicates whether the application of a data writing pulse or a data reading pulse to each memory cell is to be continued or discontinued, to the control circuit 15. During data reading, the sense amplifier circuit converts a current flowing through a memory cell into a voltage for a sensing operation. Note that the comparator circuit and the sense amplifier circuit are not shown in FIG. 1.

The present invention relates to the control of a data writing (programming) voltage supplied to each of the word lines WL0 to WLn-1 connected to the memory cell array 11 of the flash memory 10. Hereinafter, the word line voltage supply circuit 12 will be described in detail.

The word line voltage supply circuit 12 comprises a word line voltage control circuit 12a functioning as a data writing section and a word line driver circuit 12b. The word line driver circuit 12b selects and outputs a data writing pulse voltage during data writing, a data erasing pulse voltage during data erasing, and a data reading pulse voltage during data reading.

The word line driver circuit 12b comprises a conventional switch circuit. Therefore, the word line driver circuit 12b is not described herein.

The word line voltage control circuit 12a is a voltage control section comprising a voltage control circuit for controlling and outputting a voltage to be applied to each of the word lines WL0 to WLn-1 during data writing, data erasing, or data reading.

A data writing operation of the word line voltage control circuit 12a of the embodiment of the present invention will be described below.

Figure 2:
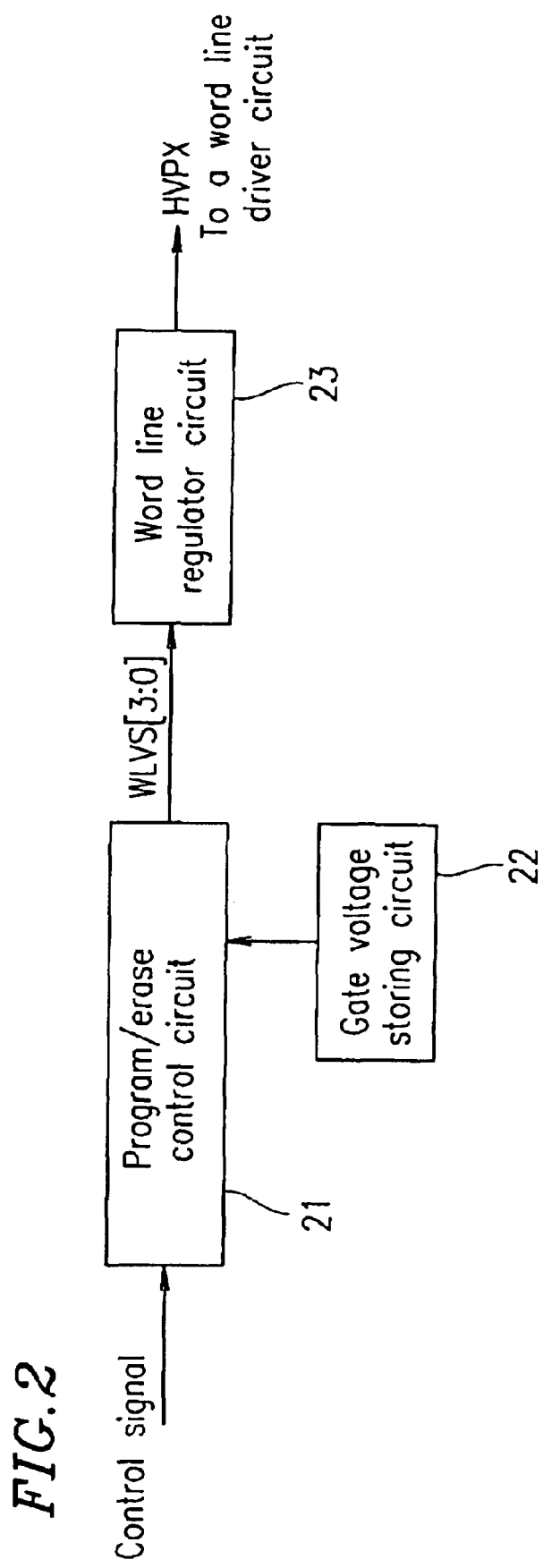
FIG. 2 shows a word line voltage control circuit of FIG. 1.

FIG. 2 shows a word line voltage control circuit 12a. The word line voltage control circuit 12a comprises a program/erase control circuit 21 functioning as a data writing section for receiving a control signal output by the control circuit 15, a gate voltage storing circuit 22 functioning as a storing section for outputting a store data signal to the program/erase control circuit 21, and a word line regulator circuit 23 functioning as a voltage output section for selecting and outputting a word line control voltage in accordance with a control signal WLVS[3:0] output by the program/erase control circuit 21.

Note that the word line regulator circuit 23 receives a store data signal directly from the gate voltage storing circuit 22 and generates a word line control voltage in accordance with the store data signal.

The word line voltage control circuit 12a having the configuration of FIG. 2 according to the embodiment of the present invention will be described below.

Data write is initiated in accordance with a control signal output by the control circuit 15. To apply a data writing pulse to each of the word lines WL0 to WLn-1, the program/erase control circuit 21 references data stored in the gate voltage storing circuit 22 and selects and outputs a control signal WLVS[3:0] based on the stored data to the word line regulator circuit 23. During data writing (programming), a signal HVPX output by the word line regulator circuit 23 of the word line voltage control circuit 12a is input to the word line driver circuit 12b (FIG. 1). Note that the control signal WLVS[3:0] represents four signals, WLVS3, WLVS2, WLVS1, and WLVS0.

Figure 3:
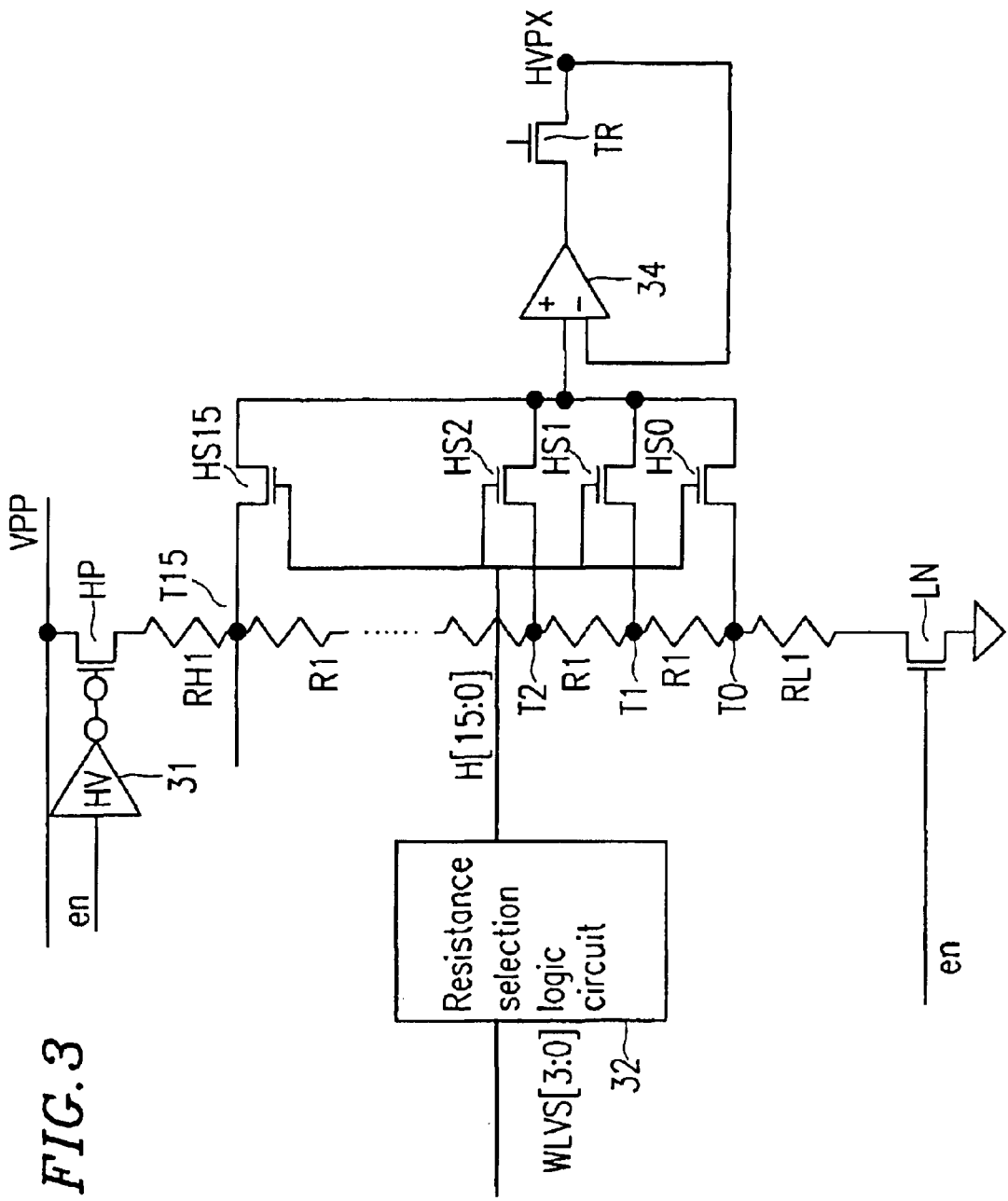
FIG. 3 shows an exemplary word line regulator circuit.

FIG. 3 shows an exemplary word line regulator circuit 23. The word line regulator circuit 23 is contained in the word line voltage control circuit 12a of FIG. 2.

The embodiment of the present invention when the control signal WLVS[3:0] is output to a resistance selection logic circuit 32 will be described. The resistance selection logic circuit 32 is contained in the word line regulator circuit 23.

The word line regulator circuit 23 comprises an inverter type level shifter circuit 31. The output terminal of the inverter type level shifter circuit 31 is connected to the gate terminal of a PMOS transistor HP. The level shifter circuit 31 receives a control signal en through the input terminal thereof. The source terminal PMOS transistor HP is connected to a power source power source VPP (e.g., 12 V). The drain terminal of the PMOS transistor HP is connected via a resistor RH1 to the terminal T15.

The terminal T15 is connected in series to an end of a series of 15 resistors R1. The connecting points of resistors R1 are indicated by terminals T14 to T1. The end terminal is indicated by a terminal T0. The terminal T0 is connected via a resistor RL1 to the drain terminal of an NMOS transistor LN. The source terminal of the NMOS transistor LN is connected to the earth (GND). The NMOS transistor LN receives a control signal en through the gate terminal thereof.

Note that the resistor RH1 and the resistor RL1, and the 15 resistors R1 connected between the resistor RH1 and the resistor RL1 constitute a division voltage output line which divides the voltage of the power source VPP. The resistor RH1 determines the maximum division voltage (upper limit value). The resistor RL1 determines the minimum division voltage (lower limit value). The 15 resistors R1 between the resistor RH1 and the resistor RL1 equally divide the voltage between the maximum division voltage (upper limit value) and the minimum division voltage (lower limit value).

The terminal T15 is connected to the drain terminal of an NMOS transistor HS15. The terminals T14 to T0 are connected to the respective drain terminals of the NMOS transistors HS14 to HS0. The source terminals of the NMOS transistor HS15 to HS0 are interconnected. The interconnected source terminals of the NMOS transistors HS15 to HS0 are connected to the positive input terminal of the amplifier 34.

The control signal WLVS[3:0] output by the program/erase control circuit 21 is input to the resistance selection logic circuit 32 which in turn outputs a control signal H[15:0]. The control signal H[15:0] is a 16-bit signal indicating a control signal H15, a control signal H14, ..., a control signal H1, and a control signal H0. The signals indicated by the control signal H[15:0] are input to the respective gate terminals of the NMOS transistors HS15 to HS0.

Note that although in FIG. 3 the resistance selection logic circuit 32 receives the control signal H[15:0] through a single output terminal, signals contained in the control signal H[15:0] are input through the respective separate output terminals.

The output terminal of the amplifier 34 is connected to the drain terminal of an NMOS transistor TR. The source terminal of the NMOS transistor TR serves as the output terminal of the word line regulator circuit 23 and is connected to the negative input terminal of the amplifier 34 to form a voltage follower circuit. The NMOS transistor TR receives the control signal en having an increased voltage through the gate terminal thereof.

Each of the NMOS transistors HS15 to HS0 outputs a reference signal in accordance with the control signal H[15:0] through the interconnected source terminal of the NMOS transistors HS15 to HS0. The reference signal is input to the positive input terminal of the amplifier 34 and is caused to have a low impedance, and is output through the output terminal of the amplifier 34.

The reference signal output through the output terminal of the amplifier 34 is input to the drain terminal of the NMOS transistor TR. The reference signal input to the drain terminal of the NMOS transistor TR is output as an output signal HVPX to the word line driver circuit 12b in accordance with the control signal en input to the gate terminal of the NMOS transistor TR.

The control signal en indicates a data writing pulse control signal. When the data writing pulse signal is output to a gate terminal, the control signal en is in the HIGH state. For example, when a control signal en is input to the gate terminal of the NMOS transistor TR, the control signal en is in the HIGH state. When the control signal en is the HIGH state, the NMOS transistor TR goes into the ON state. When the control signal en is in the LOW state, the NMOS transistor TR goes into the OFF state.

The resistance selection logic circuit 32 receives the 4-bit control signal WLVS[3:0] output from the program/erase circuit 21 and selects one of the control signals H15 to H0 in accordance with the control signal WLVS[3:0]. In other words, the resistance selection logic circuit 32 decodes the control signal WLVS[3:0] to obtain the control signal H[15:0].

The control signal WLVS[3:0] output from the program/erase control circuit 21 is a 4-bit signal indicating a signal WLVS3, a signal WLVS2, a signal WLVS1, and a signal WLVS0.

The gate voltage storing circuit 22 stores $2^4$ (=16) data values (corresponding to voltages to be applied to a control gate).

The resistance selection logic circuit 32 is, for example, a decoder circuit. Table 2 shows the control signal H[15:0] corresponding to the 4-bit control signal WLVS[3:0].

The resistance selection logic circuit 32 decodes the control signal WLVS[3:0] to obtain the control signal H[15:0].

TABLE 2

| WLVS | Output control signal H | On-state transistor |
|---|---|---|
| 0000 | 0000000000000001 | HS0 |
| 0001 | 0000000000000010 | HS1 |
| 0010 | 0000000000000100 | HS2 |
| 0011 | 0000000000001000 | HS3 |
| : | : | : |
| 1110 | 0100000000000000 | HS14 |
| 1111 | 1000000000000000 | HS15 |

When the control signal WLVS[3:0] is 0000, the output control signal H[15:0] is H0 (=0000000000000001). When the control signal WLVS[3:0] is 0000, the NMOS transistor HS0 goes to the ON state.

When the control signal WLVS[3:0] is 0001, the output control signal H[15:0] is H1 (=0000000000000010). When the control signal WLVS[3:0] is 0001, the NMOS transistor HS1 goes to the ON state.

When the control signal WLVS[3:0] is 0010, the output control signal H[15:0] is H2 (=0000000000000100). When the control signal WLVS[3:0] is 0010, the NMOS transistor HS2 goes to the ON state.

Similarly, the NMOS transistors HS3 to HS15 are selected. When the control signal WLVS[3:0] is 1111, the output control signal H[15:0] is H15 (=1000000000000000). When the control signal WLVS[3:0] is 1111, the NMOS transistor HS15 goes to the ON state.

When the output signal output from the resistance selection logic circuit 32 is the control signal H15, only the NMOS transistor HS15, into which the control signal H15 is input, goes to the ON state among the NMOS transistors HS0 to HS15, while the other 15 NMOS transistors HS0 to HS14 go to the OFF state. As a result, the NMOS transistor HS15 outputs a reference signal through the drain terminal thereof in accordance with the control signal H15. The reference signal is output as the output signal HVPX via the amplifier 34, the NMOS transistor TR, and the source terminal of the NMOS transistor TR to the word line driver circuit 12b.

When data writing (programming) is initiated and a data writing pulse voltage is applied to the control gates of memory cells, the control signal en supplied to the word line regulator circuit 23 goes to the HIGH state so that the PMOS transistor HP and the NMOS transistor LN go to the ON state. Therefore, the power source VPP is applied directly to the division voltage output line comprising the resistor RH1, the 15 resistors R1, and the resistor RL1 connected in series, so that the division voltages of the power source VPP are generated at the respective terminals T15 to T0.

For example, the resistor RH1, the resistor R1, and the resistor RL1 may be set so that the maximum division voltage (upper limit value) is 8.8 V, the minimum division voltage (lower limit value) is 7.3 V, and 0.1 V steps (resolution) between the resolution of maximum division voltage (upper limit value) and the minimum division voltage (lower limit value). As a result, a reference signal having a voltage from 7.3 V to 8.8 V in 0.1 V steps is output as a data writing pulse voltage.

The flash memory 10 comprises a word line regulator circuit 23 on a chip-by-chip basis. The flash memory 10 is subjected to a data writing test (wafer test) on a wafer on which the chip is formed. According to the result of the test, a data writing voltage to be applied to the control gate of a memory cell is optimally set on a chip-by-chip basis.

Specifically, in the data writing test, one data writing pulse voltage is applied to memory cells in each chip (one pulse). After data writing, the highest value (Vtmax) of the threshold value and the lowest value (Vtmin) of the threshold value are extracted based on the threshold voltage distribution of the memory cells. An optimal voltage value to be applied to the control gate of a memory cell in each chip is calculated based on the maximum threshold voltage or the minimum threshold voltage. The optimal voltage value is stored as stored data in the gate voltage storing circuit 22.

Therefore, in accordance with the stored data, the control signal WLVS[3:0] is input from the program/erase control circuit 21 to the word line regulator circuit 23. The control signal H[15:0] corresponding to the control signal WLVS [3:0] is selected. A data writing pulse voltage to be applied to the control gate of a memory cell in each chip is set in accordance with the selected control signal H[15:0].

Note that the program/erase control circuit 21 references the data stored in the gate voltage storing circuit 22 and selects and outputs a control signal WLVS[3:0] based on the stored data, thereby making it possible to change the data writing (programming) pulse voltage. The values of the resistor RH1, the resistor R1, and the resistor RL1 are designed so that the data writing pulse voltage can be controlled to be lower or higher than a standard (typical) value. The division voltage resolution and the number of division voltages can be easily modified by changing the number of resistors, the number of bits in the control signal WLVS, or the like.

A memory cell block (extra block) in addition to normal data storage regions in the flash memory 10 may be used as the gate voltage storing circuit 22. Alternatively, ROM may be used as the gate voltage storing circuit 22.

The gate voltage storing circuit 22 may store data calculated based on the result of a data writing test. More particularly, the gate voltage storing circuit 22 may store data calculated based on the result of a final data writing test performed before the shipment of the completed device (chip) (note that in this case a package needs to be provided with setting terminals for a test).

Hereinafter, a first exemplary data writing test for the flash memory 10 will be described.

Figure 4:
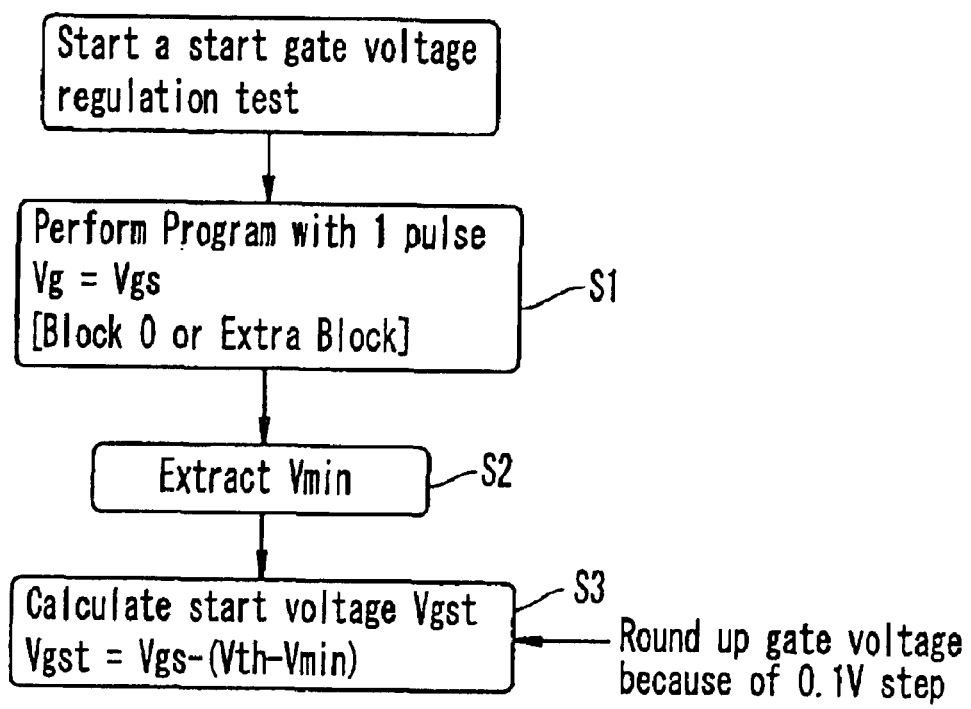
FIG. 4 shows a flowchart for a method for a first exemplary data writing test for the flash memory of FIG. 1.

FIG. 4 is a flowchart showing a method for the first exemplary data writing test (wafer test) for the flash memory 10. The first exemplary data writing test comprises steps S1 to S3.

Step S1: a single pulse of data writing voltage (control gate voltage: Vg (=Vgs)) is applied to each memory cell contained in a block 0. The block 0 is contained in a chip. The block 0 may not be contained in the memory cell array 11 and may be a specialized memory cell block (extra block) for setting a gate voltage.

A voltage applied to a memory cell varies depending on the generation of a design rule based on which a chip is produced (e.g., a chip produced according to the 0.18 μm design rule, or the like). For example, the control gate voltage Vgs is 8 V and the pulse voltage width thereof is 1 μs.

Step S2: after the control gate voltage Vg is applied to the memory cell, the lowest threshold voltage (Vtmin) is extracted based on the distribution of the threshold voltage Vt of the memory cells contained in the block 0. For example, the threshold voltages are measured to determine the lowest value.

Step S3: after the lowest threshold voltage (Vtmin) is extracted, an optimal control voltage Vgs is calculated for the memory cells in the chip.

In step S3, the data writing characteristics of the flash memory are used.

Figure 5:
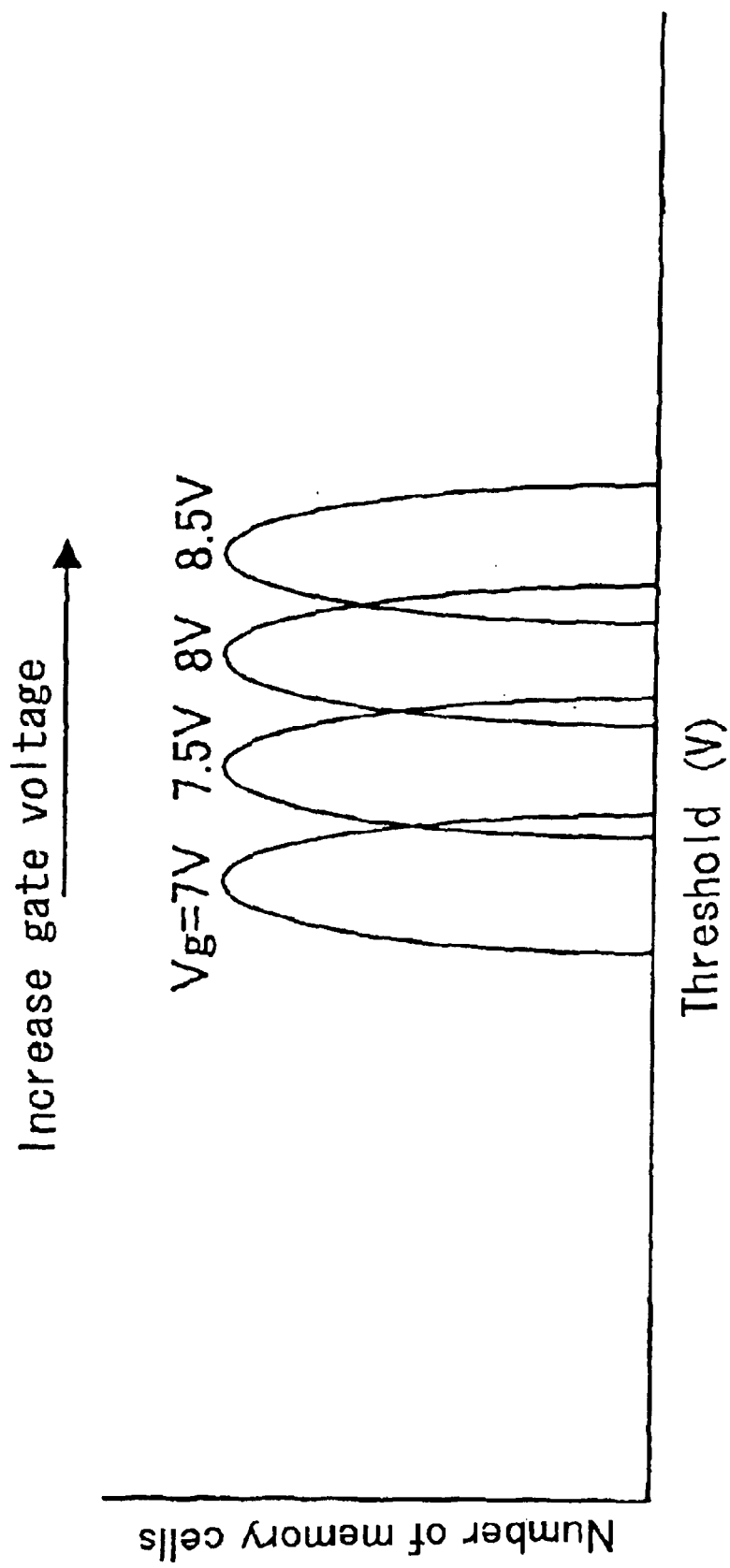
FIG. 5 shows a graph indicating the distribution of a threshold voltage corresponding to a control gate voltage which is changed.

FIG. 5 is a graph showing the distribution of the control gate voltage Vgs which is changed. In the graph, the horizontal axis represents the threshold voltage of a memory cell, while the vertical axis represents the number of memory cells.

As the control gate voltage Vgs is increased to 7.0 V, 7.5 V, 8.0 V, and 8.5 V, the peak value of the threshold voltage Vt corresponding to the control gate voltage Vgs is also increased.

An increase in the peak value of the distribution of the threshold voltage Vt is equal to a voltage increment ($\Delta$Vgs) of the control gate voltage Vgs. Therefore, $\Delta$Vgs=$\Delta$Vt is established.

For example, when a target reference threshold voltage Vref is greater than or equal to 5 V, the control gate voltage Vgs is applied in a data writing test. As a result, the lowest threshold voltage Vtmin is obtained. A control gate voltage (gate voltage to be obtained by calculation) Vgst, which is required to set the lowest threshold voltage Vtmin to be greater than or equal to the reference threshold voltage Vref, is obtained based on $\Delta$Vgs=$\Delta$Vt and is represented by:

$$Vgst=Vgs-(V\text{tmin}-V\text{ref}) \qquad (1).$$

If it is now assumed that Vgs=8.0 V and Vref=5.0 V and the lowest threshold voltage after a data writing test Vtmin= 4.82 V, expression (1) is:

$$Vgst=8\ \text{V}-(4.82\ \text{V}-5\ \text{V})=8.18\ \text{V}.$$

The resolution of a voltage output by the word line regulator circuit 23 is 0.1 V. Therefore, the voltage value Vgst 8.18 V is rounded up to 8.2 V. As a result, a voltage value of 8.2 V is stored in the gate voltage storing circuit 22 (FIG. 2).

When data is written into memory cells in a fast chip, a single pulse of data writing voltage is applied to the memory cells, so that Vtmin=5.5V. Therefore, $$Vgst=8\ \text{V}-(5.5\ \text{V}-5\ \text{V})=7.5\ \text{V}.$$

As a result, a voltage of 7.5 V is stored in the gate voltage storing circuit 22.

When data is written into memory cells in a slow chip, a single pulse of data writing voltage is applied to the memory cells, so that Vtmin=4.5V. Therefore, $$Vgst=8\ \text{V}-(4.5\ \text{V}-5\ \text{V})=8.5\ \text{V}.$$

As a result, a voltage of 8.5 V is stored in the gate voltage storing circuit 22.

Figure 6:
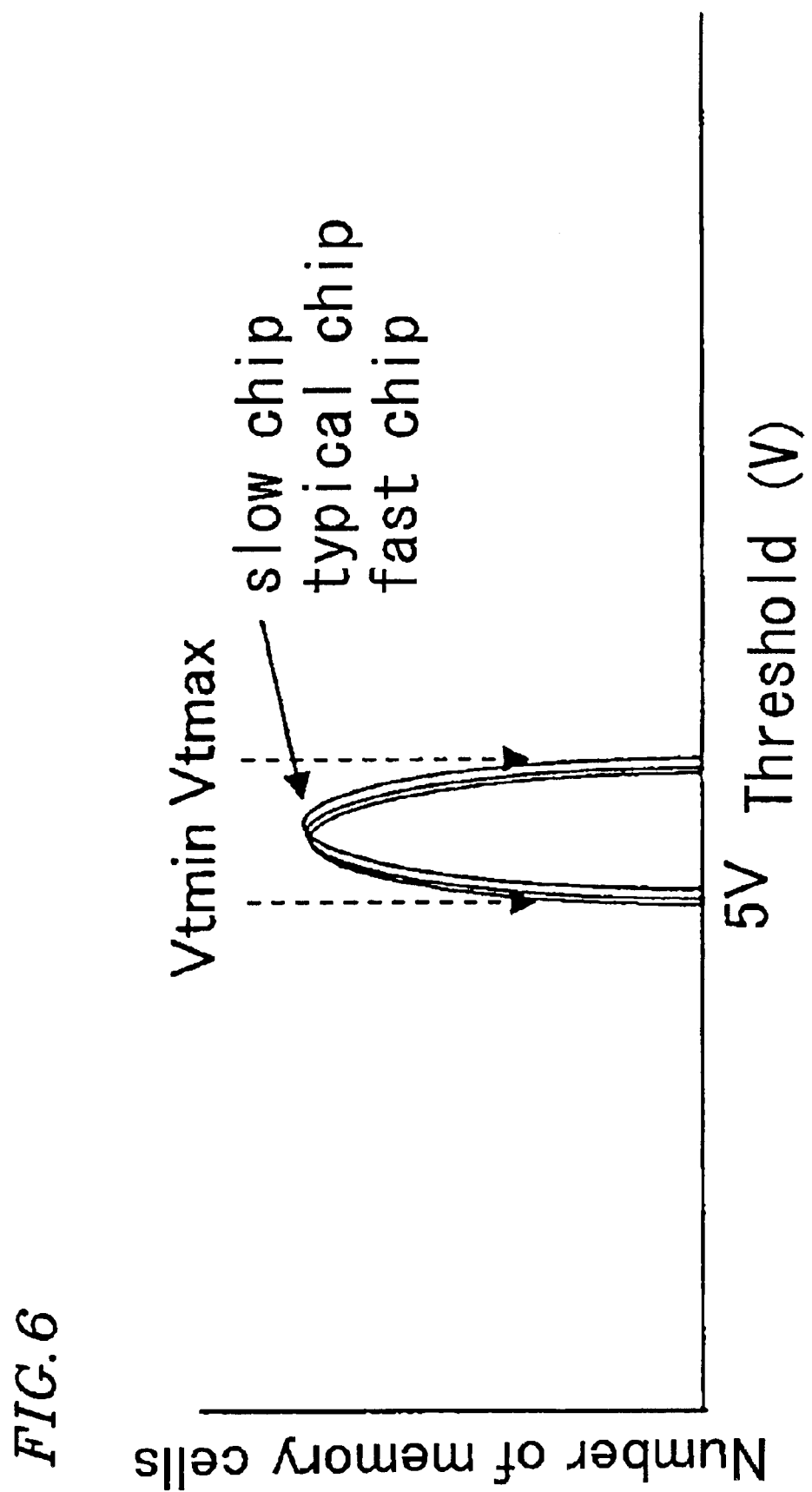
FIG. 6 shows a graph indicating the distribution of the threshold voltages Vt of memory cells after data writing of a fast chip, a typical chip, and a slow chip.

FIG. 6 shows a graph indicating the distribution of the threshold voltages Vt of memory cells after data writing of a fast chip, a typical chip, and a slow chip.

By changing a data writing (programming) pulse voltage in accordance with the electrical characteristics of memory cells on a chip-by-chip basis, the distributions of the threshold voltages Vt of memory cells after data writing in a fast chip, a typical chip, and a slow chip can be set to be between about 5.0 V to about 6.0 V irrespective of the electrical characteristics of each memory cell (FIG. 6).

Therefore, extra stress, which is caused by an electric field between a semiconductor substrate and a floating gate, is not exerted on a tunnel oxide film in a memory cell during data erasing. As a result, it is possible to prevent the deterioration of the data holding reliability of a flash memory. In addition, by applying a single pulse of data writing voltage to a memory cell, the threshold voltage of the memory cell is set to be greater than or equal to a reference threshold voltage. As a result, a reduction in data writing rate can be prevented.

Hereinafter, a second exemplary data writing test (wafer test) for the flash memory 10 will be described.

The threshold voltage distribution of memory cells varies between blocks contained in the same chip as well as between chips.

Figure 7:
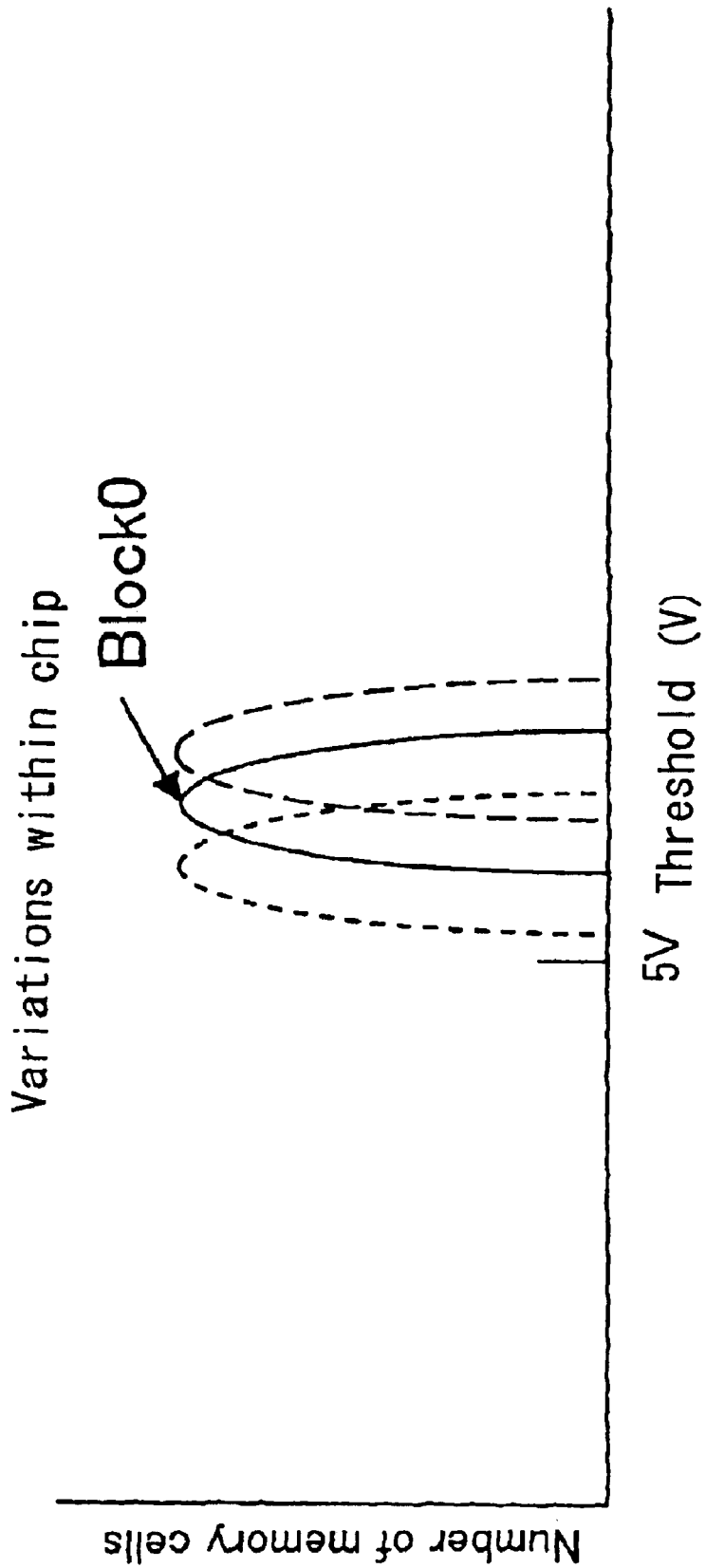
FIG. 7 shows an exemplary variation in the threshold voltage distribution of memory cells in blocks of the same chip.

FIG. 7 shows an exemplary variation in the threshold voltage distribution of memory cells in blocks of the same chip. One of the causes for variations in threshold voltage is considered to be a reduction in a control gate voltage and a drain voltage applied to a memory cell in a memory array due to line resistance. It is considered that the voltage reduction due to the line resistance leads to variations in the threshold voltage of a memory cell from block to block.

In some blocks, application of a single pulse of data writing pulse voltage may not complete data writing due to variations in the threshold voltages of memory cells. Therefore, the data writing rate of the memory cell varies from block to block.

Figure 8:
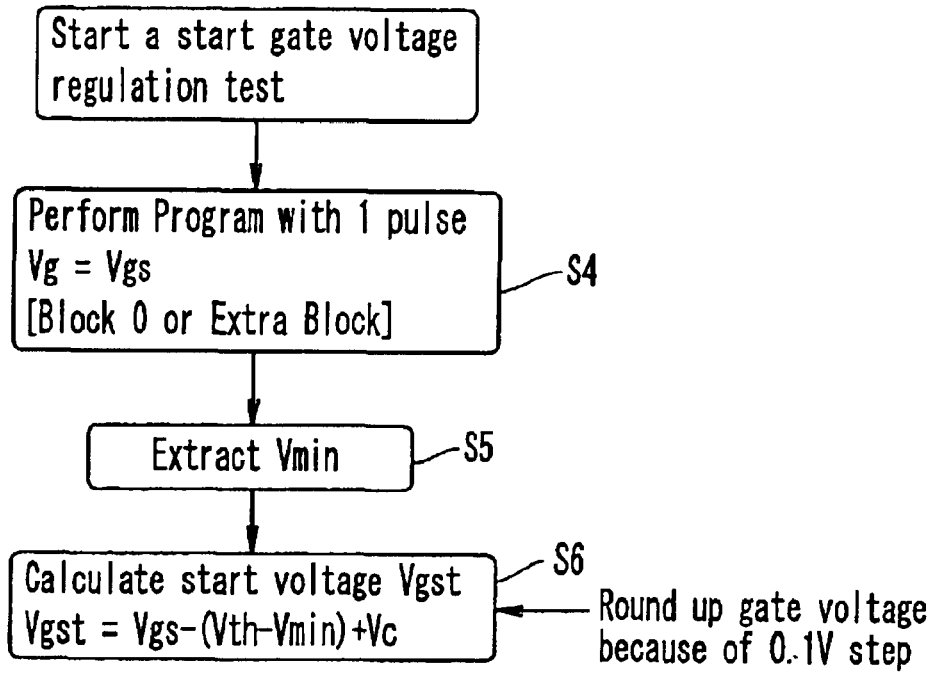
FIG. 8 shows a flowchart for a second exemplary method of a data writing test for the flash memory of FIG. 1.

FIG. 8 is a flowchart showing a second exemplary method of a data writing test for the flash memory 10. The method comprises steps S4 to S6.

Steps S4 to S6 are the same as steps S1 to S3 in the first example, except that a control gate voltage is determined by expression (2) instead of (1).

$$Vgst=Vgs-(Vt\min-Vref)+Vc \qquad (2)$$

where Vc is a correction value for variations in threshold voltage from block to block. For example, Vc=about 0.2 V.

By correcting variations in threshold voltage from block to block, data writing can be completed by applying only one pulse of data writing voltage to all blocks in a chip. Therefore, a stable data writing rate can be obtained.

A chip is subjected to a data writing test (wafer test) on a chip-by-chip basis. The gate voltage storing circuit 22 stores the value of Vc and a block number based on the result of the test.

For example, the control gate voltage Vgst of a block 0 is represented by:

$$Vgst=Vgs-(Vt\min-Vref).$$

The control gate voltage Vgst of a block 1 is represented by:

$$Vgst=Vgs-(Vt\min-Vref)+Vc.$$

The control gate voltage Vgst of a block 2 is represented by:

$$Vgst=Vgs-(Vt\min-Vref)+2Vc.$$

Thus, a control gate voltage which is different from block to block is output to a word line.

Note that when an arrangement of memory cells, a word line drive circuit, a bit line drive circuit, a common source line drive circuit, and the like in a flash memory is determined, a pattern wiring length and the like are determined. As a result, the need for correction of the threshold voltage of memory cell on a block-by-block basis is determined. Therefore, a block number is not required. Only the value of Vc generated by variations in a production process is stored. A predetermined value of Vc may be set on a block-by-block basis. Alternatively, a worst value Vc may be fixed and used instead of setting a predetermined Vc on a block-by-block basis.

Hereinafter, a third exemplary data writing test (wafer test) for the flash memory 10 will be described.

E/W performance, in which data writing and data erasing are alternately repeated, has a large influence on the flash memory 10.

Figure 22:
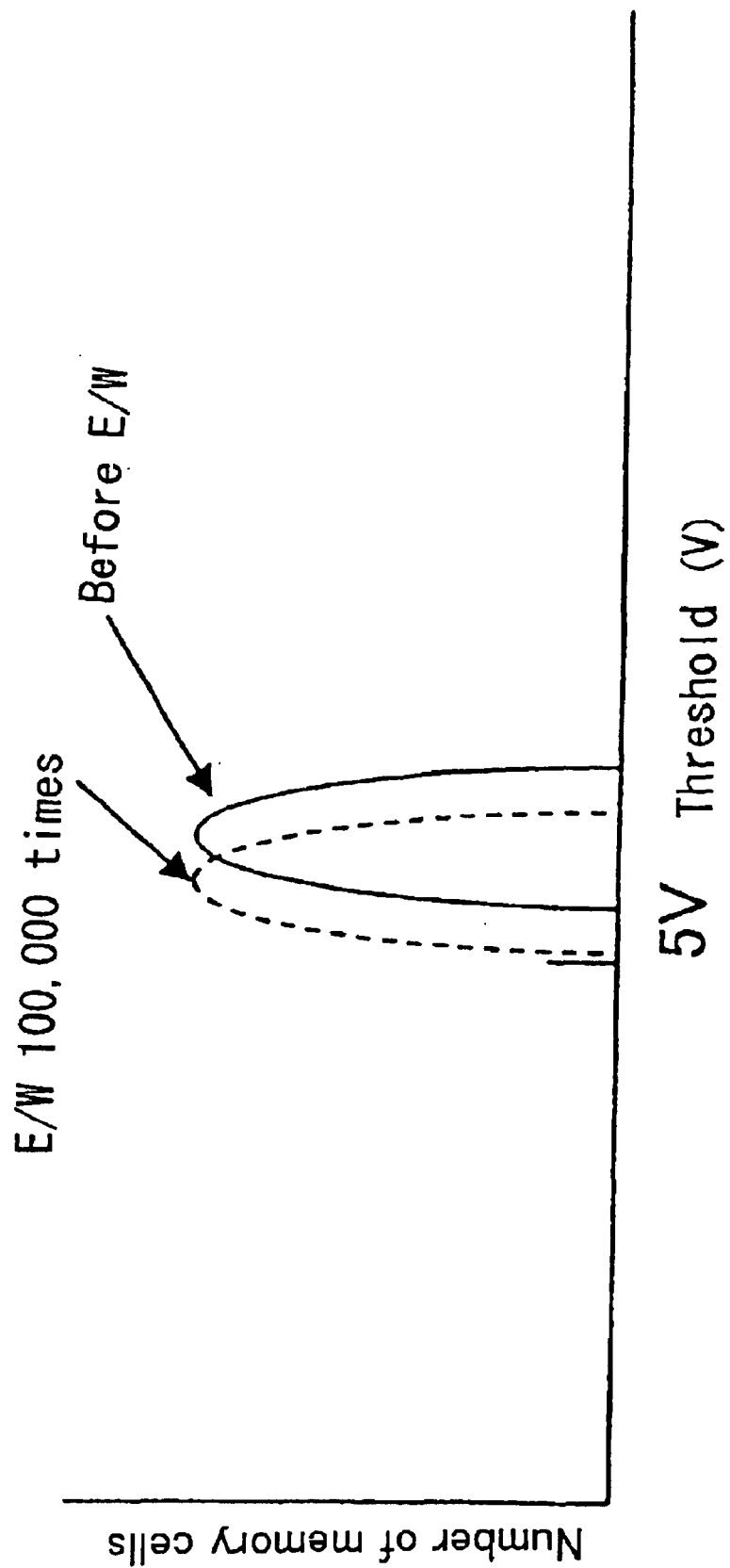
FIG. 22 shows a graph indicating an example in which the threshold voltage distribution of memory cells is shifted toward a lower voltage region.

FIG. 22 is a graph showing an example in which the threshold voltage distribution of memory cells is shifted toward a lower voltage region. In the graph, the horizontal axis represents the threshold voltage of a memory cell, while the vertical axis represents the number of memory cells.

The distribution of the threshold voltages Vt of memory cells, which is represented by a dashed line, was obtained by applying a single pulse of data writing voltage to the memory cells, then repeating data writing and data erasing alternately 100,000 times, and then applying a single pulse of data writing voltage to the memory cells.

The distribution of the threshold voltages Vt of memory cells (dashed line) is shifted toward a lower voltage region as compared to that before the E/W performance (solid line). It is necessary to ensure that the distribution of the threshold voltages Vt of memory cells (dashed line) is greater than or equal to a reference threshold voltage.

Note that "E/W" indicates that data erasing and data writing are alternately repeated in FIG. 22.

Figure 9:
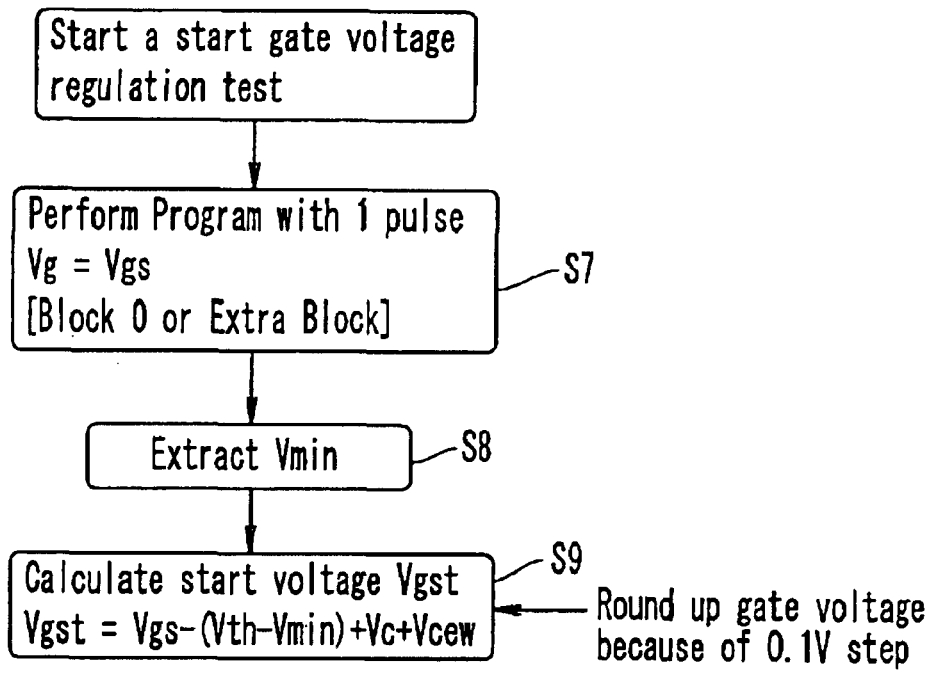
FIG. 9 shows a flowchart for a third exemplary method of a data writing test for the flash memory of FIG. 1.

FIG. 9 is a flowchart showing a third exemplary method for a data writing test for the flash memory 10. The method comprises steps S7 to step S9.

Steps S7 to S9 are the same as steps S4 to S6 in the second example, except that a control gate voltage is determined by expression (3) instead of (2).

$$Vgst=Vgs-(Vt\min-Vref)+Vc+Vcew \qquad (3)$$

where Vcew is a correction value which is determined by expecting that the distribution of the threshold voltage Vt will be shifted toward a lower voltage region after repeating data writing and data erasing alternately. For example, Vcew=about 0.2 V.

Therefore, by adding the correction value Vcew to the expression for determining a control gate voltage, a single pulse of data writing voltage can complete data writing after repeating data writing and data erasing alternately. As a result, a reduction in data writing rate can be prevented.

Note that a control gate voltage may be determined by the following expression (4).

$$Vgst=Vgs-(Vt\min-Vref)+Vcew \qquad (4)$$

When a control gate voltage is determined by expression (4), a value calculated based on the result of a test after a data writing test (wafer test), to which Vcew is added, is stored in the gate voltage storing circuit 22.

A flash memory may comprise a counter circuit for counting the number of E/W cycles. A value calculated based on the result of a test after a data writing test and the value of Vcew may be separately stored in the gate voltage storing circuit 22. In this case, a control gate voltage represented by expression (1) or (2) may be initially output to a word line. After the number of E/W cycles counted by the counter circuit reaches a predetermined value, a control gate voltage represented by expression (4), to which Vcew is added, may be output to a word line.

Hereinafter, a fourth exemplary data writing test (wafer test) for a multi-value flash memory capable of storing a plurality of different data values will be described.

Figure 10:
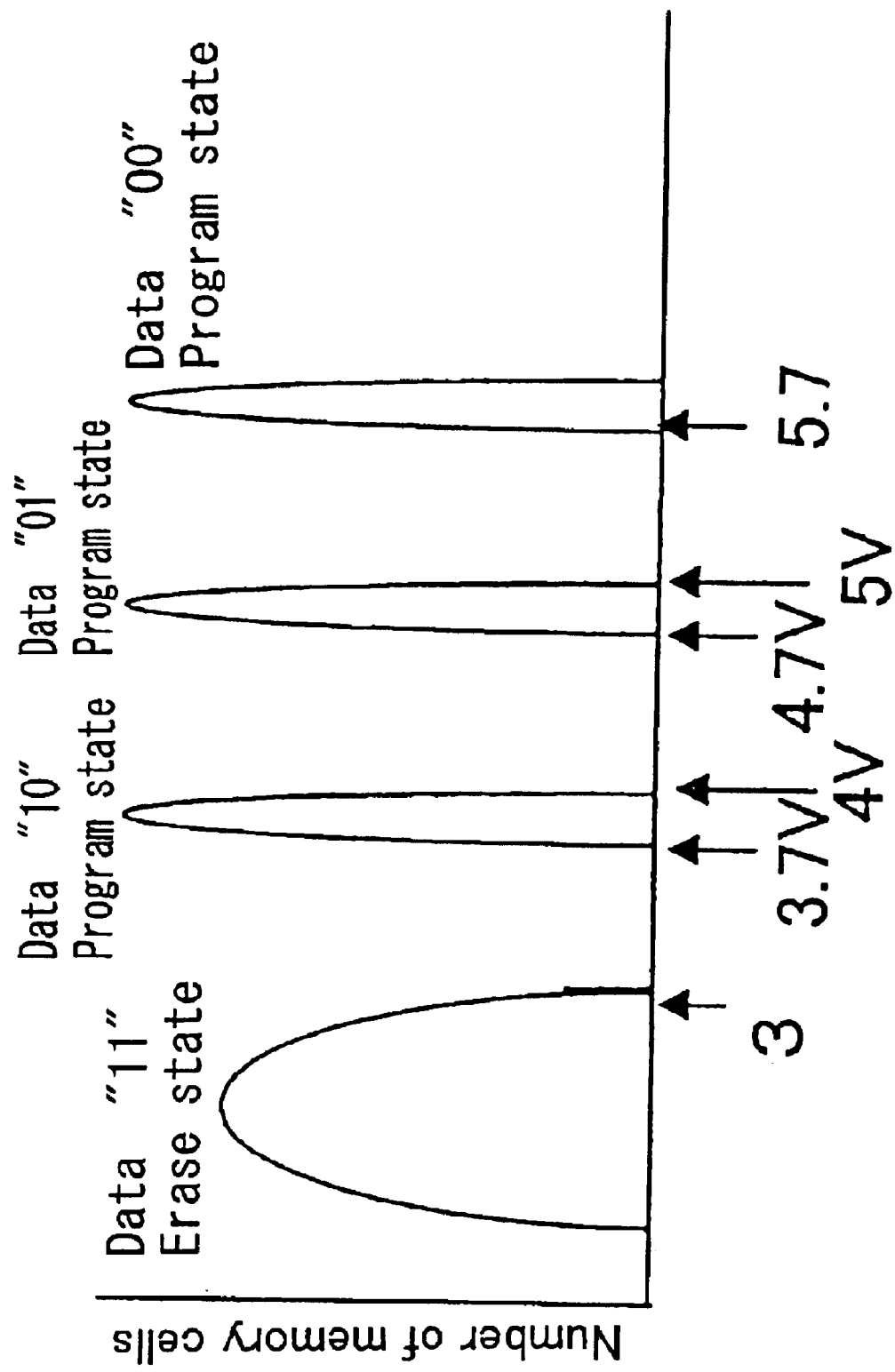
FIG. 10 shows a graph showing the distribution of the threshold voltages of memory cells in a four-value flash memory.

FIG. 10 is a graph showing the distribution of the threshold voltages of memory cells in a four-value flash memory. In the graph, the horizontal axis represents the threshold voltage of a memory cell, while the vertical axis represents the number of memory cells. Note that the four-value flash memory is an example of multi-value flash memory.

Data "11" indicates a data erased state. Data "10" indicates a data written (programmed) state. Data "01" indicates a data written (programmed) state. Data "00" indicates a data written (programmed) state.

In the fourth exemplary data writing test (wafer test), a description will be given of a particular case that when a reference threshold voltage is 3.7 V to 4.0 V, a data writing test is carried out for a memory cell in a data written (programmed) state (Data "10").

Figure 11:
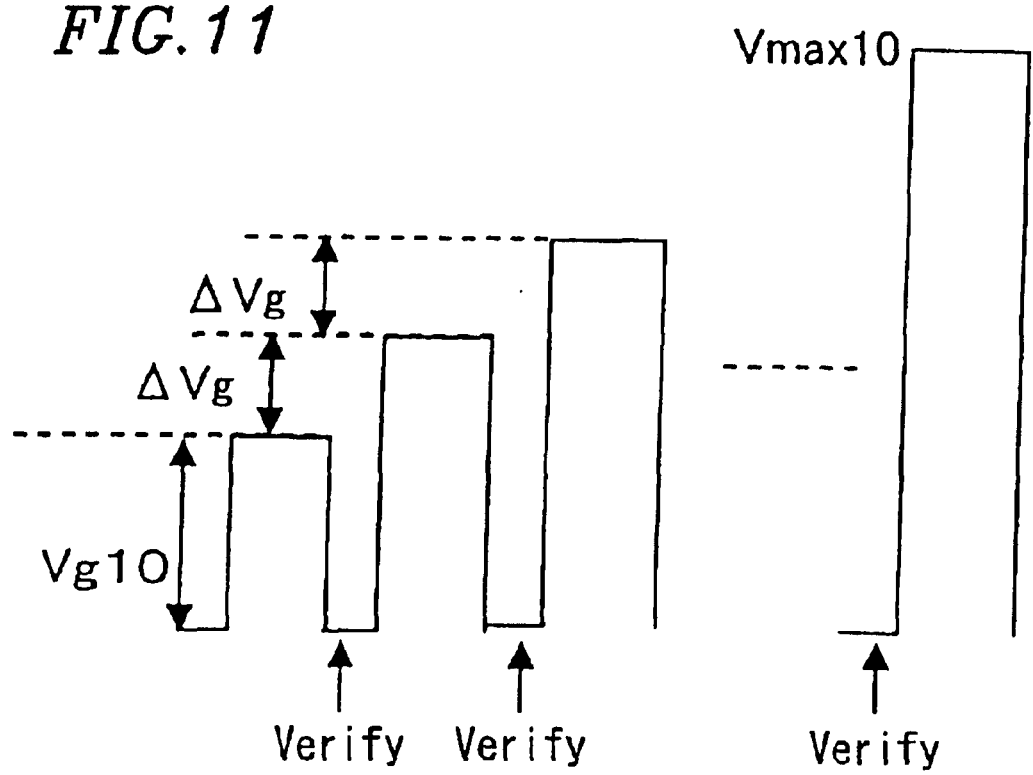
FIG. 11 shows the waveforms of voltages applied to the control gate of a memory cell when data writing is performed to a memory cell in a data written (programmed) state (Data "10").

FIG. 11 shows the waveforms of voltages applied to the control gate of a memory cell when data writing is performed to a memory cell in a data written (programmed) state (Data "10").

A start control gate voltage applied via a word line to a memory cell is Vg10.

Figure 12:
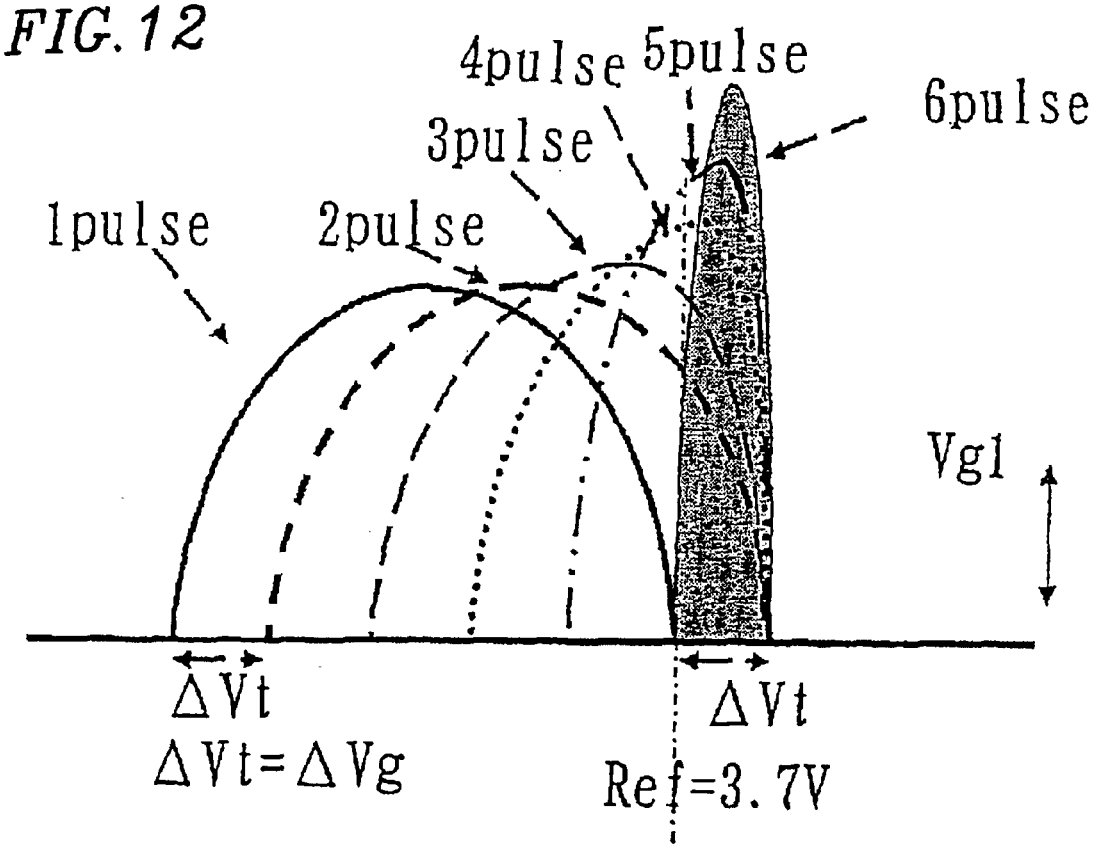
FIG. 12 shows changes in threshold voltages when a data writing (programming) algorithm using gate voltage steps shown in FIG. 11 is carried out.

FIG. 12 shows changes in threshold voltages when a data writing (programming) algorithm using gate voltage steps shown in FIG. 11 is carried out.

For example, when a verify cell using a reference threshold voltage of 3.7 V is used, a start data writing pulse voltage to be applied is a gate voltage of Vg10. After the start data writing pulse voltage has been applied, the threshold voltage of a memory cell is verified. As used herein, the term "verify" refers to determination of the threshold voltage of a memory cell after application of a data writing pulse voltage. Verification is performed in the same manner as data reading.

Figure 18:
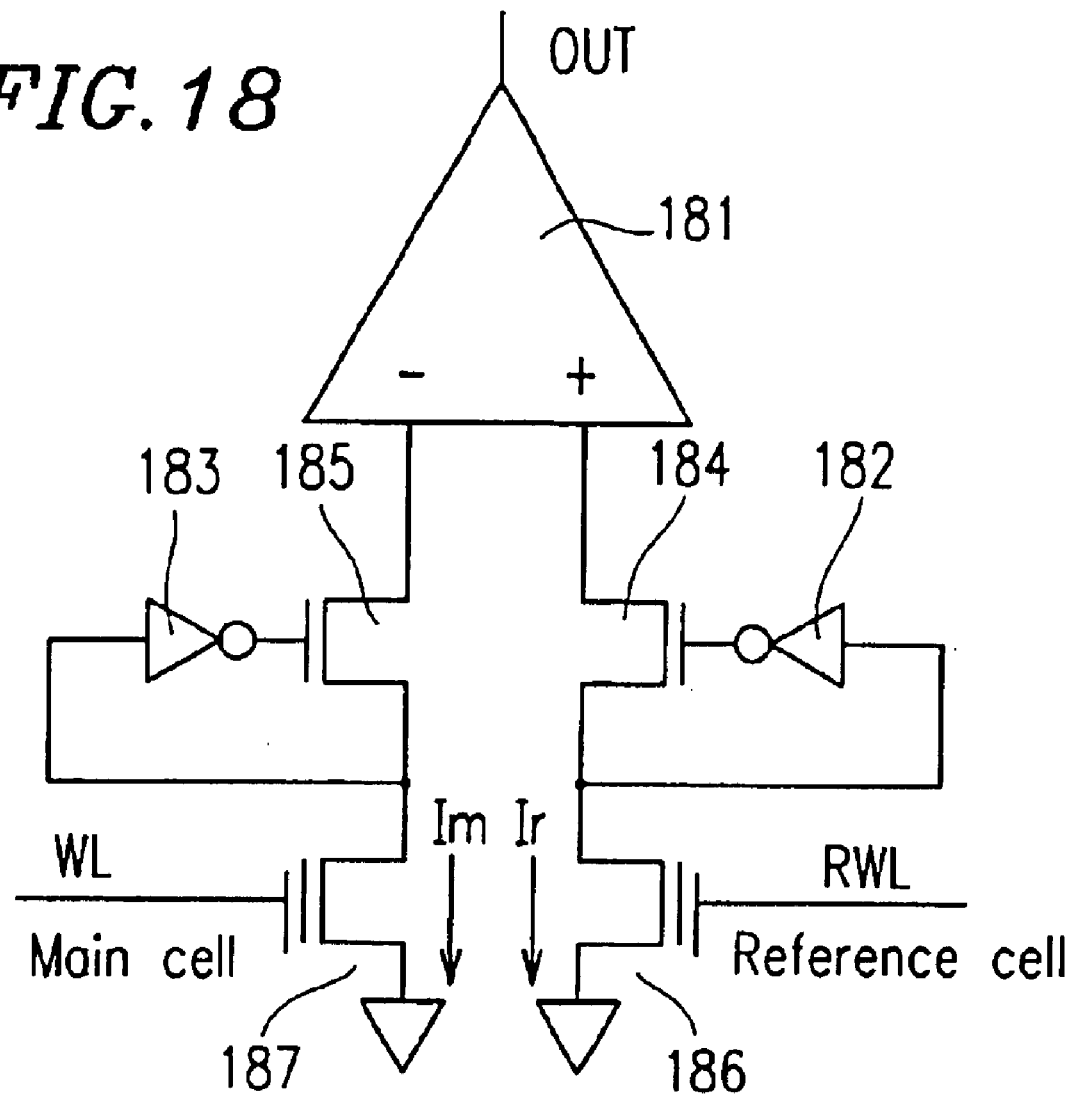
FIG. 18 shows a configuration of a sense amplifier circuit.

A reference cell (verify cell) for verifying data writing is used instead of a reference cell 186 for data reading (FIG. 18).

After data writing, when the threshold voltage of a memory cell goes higher than or equal to 3.7 V, the application of a data writing pulse voltage to the memory cell is ended. Specifically, a drain voltage is not output.

After data writing, a data writing pulse voltage is applied again to memory cells having a threshold voltage of less than 3.7 V. The gate voltage is Vg10+ΔVg (FIG. 11) where ΔVg is, for example, 200 mV. Note that the value of ΔVg is determined depending on the distribution width of predetermined voltages. Theoretically, when the distribution width of voltages is 200 mV, ΔVt=ΔVg.

After application of a data writing pulse voltage, verification is performed again.

After verification, if the threshold voltage of a memory cell is determined to be greater than or equal to 3.7 V, application of a data writing pulse voltage is stopped.

If the threshold voltage of a memory cell is determined to be smaller than 3.7 V, a data writing pulse voltage is applied to the memory cell where the gate voltage is Vg10+2×ΔVg.

Thus, application of a data write pulse voltage and verification are repeated until all memory cells have a threshold voltage of 3.7 V or more.

To write data, Data "01" and Data "00", start data writing (programming) pulse voltages, Vg01 and Vg00, are used for data writing (programming). In this case, the reference threshold voltages of respective verify cells are, for example, 4.7 V and 5.7 V. Data writing is performed in the above-described manner.

If a gate voltage (program start voltage) of FIG. 11 is fixed between different chips, variations in threshold voltage distribution occur. This is because threshold voltage distribution varies between chips as described in the first example. This lead to a reduction in data writing rate and the occurrence of error in data reading after data writing.

Figure 13:
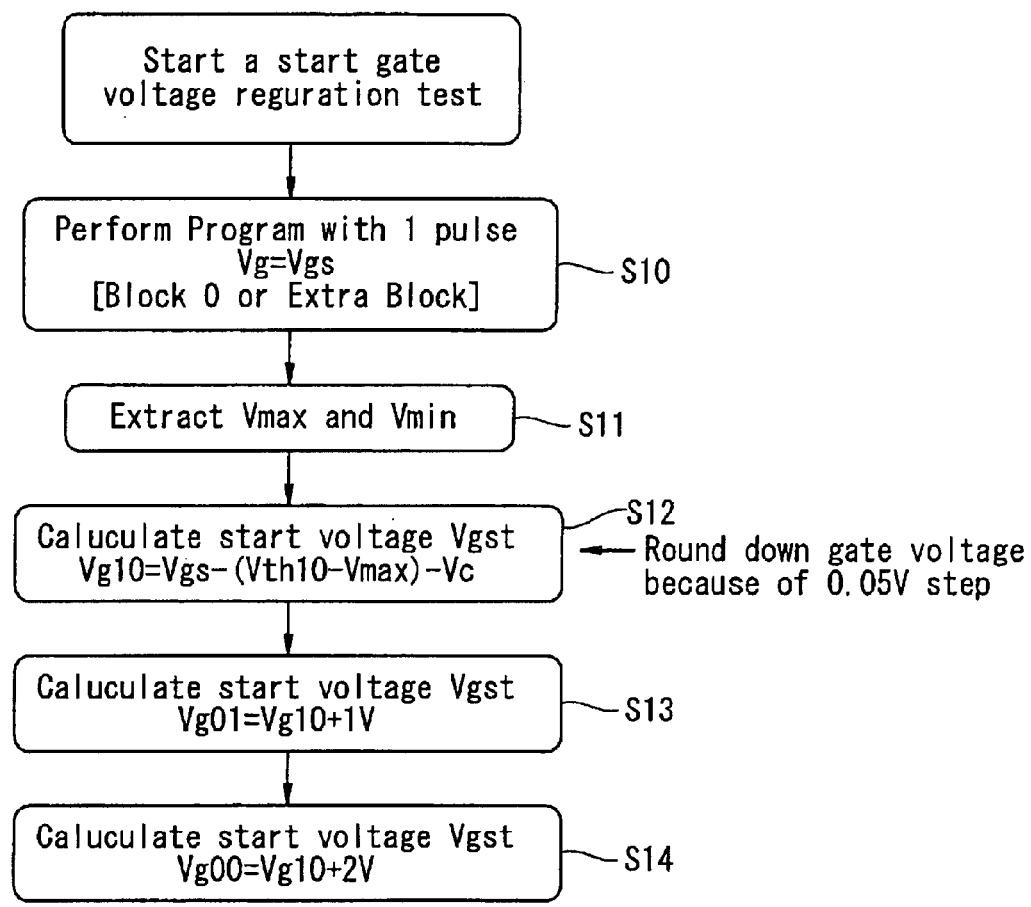
FIG. 13 shows a flowchart for a data writing test which solves a problem with four-value flash memories.

FIG. 13 is a flowchart for a data writing test method which solves the above-described problem with four-value flash memories. The method comprises steps S10 to S14.

Step S10: a single pulse of data writing voltage (control gate voltage Vg) is applied to each memory cell of any block in a chip (e.g., a block 0 or a specialized block for determining a gate voltage (Extra Block)) to perform data writing (programming).

Figure 14:
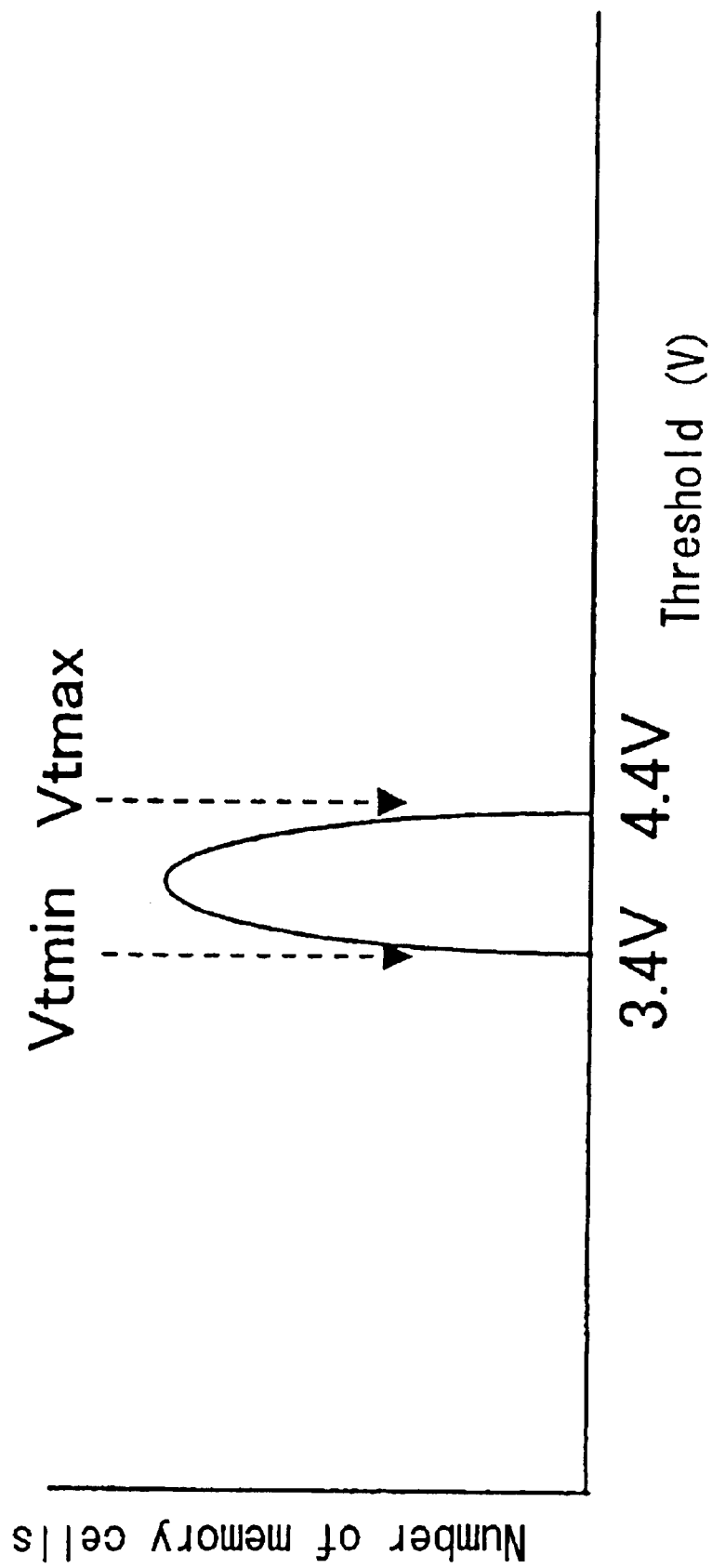
FIG. 14 shows the threshold voltage distribution of memory cells after data writing when a single pulse of data writing voltage is applied to the memories where the control gate voltage is 6V and the pulse voltage width is 1 µs.

FIG. 14 shows the threshold voltage distribution of memory cells after data writing when a single pulse of data writing voltage is applied to the memories where the control gate voltage Vg is 6V and the pulse voltage width is 1 μs. In the graph, the horizontal axis represents the threshold voltage of a memory cell, while the vertical axis represents the number of memory cells.

Step S11: the threshold voltage distribution of memory cells of any block in the chip is measured and the highest threshold voltage (Vtmax) and the lowest threshold voltage (Vtmin) are extracted.

It is now assumed, for example, that the highest threshold voltage (Vtmax)=4.4 V and the lowest threshold voltage (Vtmin)=3.4 V (FIG. 14).

In the case of a data writing test of multi-value flash memories, the value of the highest threshold voltage (Vtmax) is required. This is because the spread of the threshold voltage distributions of memory cells corresponding to data values needs to be suppressed in order to prevent error in reading four data values. Therefore, the upper and lower limit values of the threshold voltage should be taken into consideration. The threshold voltage distribution needs to be converged in the vicinity of the highest threshold voltage (Vtmax) during data writing (FIG. 12). In addition, the correction value Vc is taken into consideration.

Step S12: a control gate voltage Vg10 for data writing (programming) of Data "10" is calculated according to expression (5).

$$Vg10=Vgs-(Vt\max-Vth10)-Vc \quad (5)$$

where Vc represents a voltage for correcting variations from block to block; Vth10 represents a reference threshold voltage of a verify cell used in verification of Data "10" and the reference threshold voltage Vth10 is 3.7 V in the fourth exemplary data writing test.

Vc has a voltage value for compensating for variations in the electrical characteristics of memory cells. In the fourth exemplary data writing test, Vc=about 0.4 V.

The reference threshold voltage of reference cells for verification of Data "01" is 4.7 V (Vth01=4.7 V). Therefore, the reference threshold voltage is different by 1.0 V (Vth01–Vth10) from the reference threshold voltage 3.7 V (Vth10=3.7 V) for Data "10".

The reference threshold voltage of reference cells for verification of Data "00" is 5.7 V (Vth00=5.7 V). Therefore, the reference threshold voltage is different by 2.0 V (Vth00–Vth10) from the reference threshold voltage 3.7 V (Vth10=3.7 V) for Data "10".

Step S13: a control gate voltage Vg01 for data writing (programming) of Data "01" is calculated by expression (6).

$$Vg01 = Vg10 + 1V \quad (6)$$

(generally, Vg01=Vg10+(Vth01−Vth10))

Step S14: a control gate voltage Vg00 for data writing (programming) of Data "00" is calculated by expression (7).

$$Vg00 = Vg10 + 2V \quad (7)$$

(generally, Vg00=Vg10+(Vth00−Vth10))

The control gate voltage values calculated in the data writing test are stored in the data voltage storing circuit 22. To apply a data writing pulse voltage, data corresponding to a memory cell in the data written (programmed) state (Data "10"), a memory cell in the data written (programmed) state (Data "01") or a memory cell in the data written (programmed) state (Data "00") is read out from the data voltage storing circuit 22 and is converted into a control gate voltage which is in turn output to a word line.

Note that in a data writing test (wafer test) for four-value flash memories, the correction value Vc is used. This is because the spread of the threshold voltage distributions of memory cells corresponding to data values needs to be suppressed in order to prevent error in reading four data values. If variations in the threshold voltage distribution of memory cells within a chip is negligible, Vc may not be used. In addition, the correction value Vcew may be used, taking into account the E/W repetition (data writing and data erasing are repeated alternately).

In a data writing test for four-value flash memories, in order to suppress the spread of the threshold voltage distributions for four data values, the number of resistors R1 which constitute the division voltage output line within the word line regulator circuit 23 of FIG. 3 maybe doubled, while the number of control signals H output from the resistance selection logic circuit 32 may be doubled by adding one bit to the 4-bit control signal WLVS. Therefore, the word line regulator circuit 23 in the four-value flash memory has a resolution of 0.05 V between the maximum division voltage and the minimum division voltage.

In this case, even if there are variations in the threshold voltages of memory cells in each chip during data writing (programming), the threshold voltage distributions of memory cells in all chips on an entire wafer are completely separated into data values as shown in FIG. 10. Here, the number of data writing pulse voltages (the number of pulses) required for completing data writing is the same (about 6) among all chips, as shown in FIG. 12.

As described above, the four-value flash memory of the embodiment of the present invention can have optimal data writing gate voltages on a chip-by-chip basis, thereby optimizing the data writing rate and the threshold voltage distribution width of a memory cell. Thus, data reading error can be prevented and a highly reliable four-value flash memory (device) can be achieved.

Hereinafter, a fifth exemplary data writing test (wafer test) for four-value flash memories will be described.

For data writing of a four-value flash memory in the fifth example, a gate voltage step data writing (programming) algorithm is used even for Data "00". In actual practice, however, it is preferable that a data writing time is reduced as much as possible. To obtain Data "00", the threshold voltage is greater than or equal to 5.7 V. The spread of the threshold voltage distribution does not need to be suppressed as compared to the other data values, Data "01" and Data "10". Therefore, the data writing of Data "00" may be carried out by a single pulse of data writing voltage.

Figure 15:
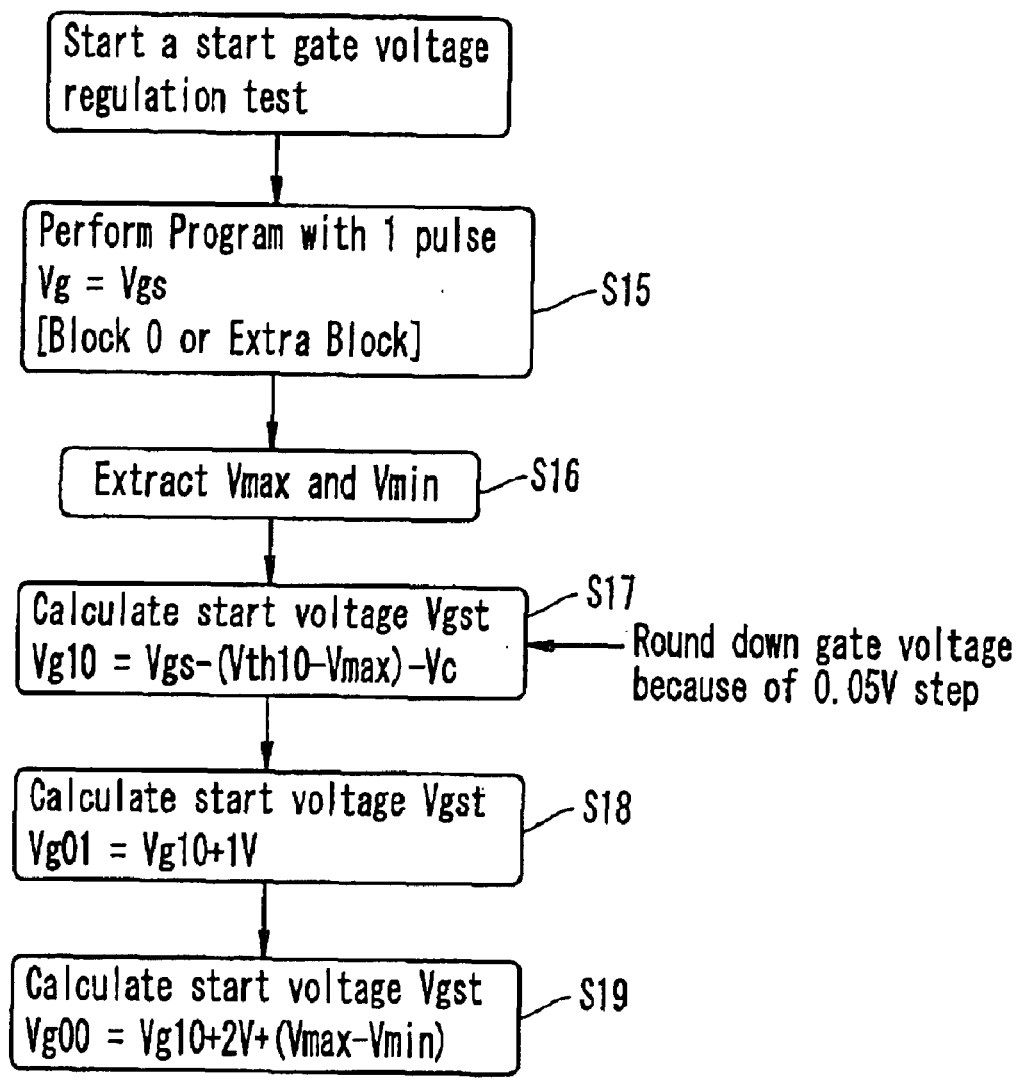
FIG. 15 shows a flowchart for a fifth exemplary data writing test method for four-value flash memories.

FIG. 15 is a flowchart showing a fifth exemplary data writing test method (wafer test) for four-value flash memories. The test method comprises steps S15 to S19.

Steps S15 to S19 are the same as steps S10 to S14 in the fourth example, except that a control gate voltage is determined by expression (8) instead of (7).

$$Vg00 = Vg10 + 2V + (Vtmax - Vtmin) \quad (8)$$

(generally, Vg00=Vg10+(Vth00−Vth10)+(Vtmax−Vtmin))

Thus, the data writing of the final data value, Data "00" can be achieved by a single pulse of data writing voltage, where the data writing causes the threshold voltage of a memory cell to be greater than or equal to 5.7 V. As a result, a data writing time can be reduced.

Thus, a data writing test (wafer test) is performed, and based on the result of the test, a data writing pulse voltage is determined. As a result, data reading error can be prevented, whereby a highly reliable four-value flash memory can be obtained.

In the four-value flash memories of the fourth and fifth examples, the spread of the threshold voltage distributions corresponding to data values of memory cells can be further narrowed. As a result, the number of value levels in a multi-value memory can be increased.

In the non-volatile semiconductor memory of the present invention (flash memory), data writing is performed in a manner that optimizes a data writing pulse voltage on a chip-by-chip basis. However, the data writing method of the non-volatile semiconductor memory of the present invention (flash memory) includes, but is not limited to, a channel hot electron method, a method using the Fowler-Nordheim (FN) tunnel phenomenon, and the like.

Memory cells contained in the non-volatile semiconductor memory of the present invention (flash memory) may constitute a memory cell array structure of the NOR type, NAND type, AND type, or the like. The present invention is not limited to this. Memory cells contained in the non-volatile semiconductor memory of the present invention (flash memory) may have a triple well structure or the like. The present invention is not limited to this.

The non-volatile semiconductor memory of the present invention comprises a plurality of memory cells capable of electrically writing and erasing information, which are arranged in a row direction and a column direction. The control terminal of the memory cell is connected to a row line in the row direction, while the drive terminal of the memory cell is connected to a column line in the column direction. A voltage control section for controlling a control voltage applied to the row line comprises: a storing section for storing the value of the control voltage, which is calculated to permit a threshold voltage distribution to be within a predetermined range, in accordance with the threshold voltage distribution of memory cells in each chip; and a voltage output section for outputting the control voltage, which is determined using the value stored in the storing section, to a row line. Thus, the voltage control section can control the distribution of the threshold voltages Vt of memory cells after data writing (programming) on a chip-by-chip (device-by-device) basis. As a result, a deterioration in the reliability of data holding and a reduction in data writing rate can be prevented.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device, comprising:

a plurality of memory cells capable of electrically writing and erasing data, the plurality of memory cells being arranged in a row direction and in a column direction, a control terminal of each of the plurality of memory cells being connected to one of a plurality of row lines provided in the row direction, and a drive terminal of each of the plurality of memory cells being connected to one of a plurality of column lines provided in the column direction; and a voltage control section for controlling a control voltage to be applied to each of the plurality of row lines, wherein:

the voltage control section comprises a storing section and a voltage output section;

the storing section stores a value of the control voltage, which is calculated to permit a threshold voltage distribution to be within a predetermined range, in accordance with the threshold voltage distribution of the plurality of memory cells in each chip; and the voltage output section outputs the control voltage having the value stored in the storing section to each of the plurality of row lines.

2. A non-volatile semiconductor memory device according to claim 1, wherein:

the voltage output section comprises a voltage selection section; and the voltage selection section selects the control voltage based on the values of the control voltage stored in the storing section.

3. A non-volatile semiconductor memory device according to claim 1, wherein each of the plurality of memory cells is a floating gate field effect transistor.

4. A non-volatile semiconductor memory device according to claim 3, wherein each of the plurality of memory cells is capable of writing a plurality of different data values, which constitute multi-value information.

5. A non-volatile semiconductor memory device according to claim 4, wherein if predetermined information having a threshold voltage less than the highest reference threshold voltage of the reference threshold voltages of the multi-value information is written, the value of the control voltage stored in the storing section is obtained based on a difference between the highest threshold voltage value extracted based on the threshold voltage distribution after the predetermined information has been written and the reference threshold voltage corresponding to the predetermined information.

6. A non-volatile semiconductor memory device according to claim 5, wherein the value of the control voltage stored in the storing section contains a correction value obtained by considering variations in threshold voltage distribution between blocks contained in the chip.

7. A non-volatile semiconductor memory device according to claim 6, wherein the correction value further contains a value indicating a shift amount of the threshold voltage distribution after data writing and data erasing have been repeated alternately.

8. A non-volatile semiconductor memory device according to claim 4, wherein if information having a threshold voltage equal to the highest reference threshold voltage of the reference threshold voltages of the multi-value information is written, the value of the control voltage stored in the storing section is obtained based on a difference between the highest and lowest threshold voltage values extracted based on the threshold voltage distribution after the predetermined information has been written.

9. A non-volatile semiconductor memory device according to claim 8, wherein the value of the control voltage stored in the storing section contains a correction value obtained by considering variations in the threshold voltage distribution between blocks contained in the chip.

10. A non-volatile semiconductor memory device according to claim 9, wherein the correction value further contains a value indicating a shift amount of the threshold voltage distribution after data writing and data erasing have been repeated alternately.

11. A non-volatile semiconductor memory device according to claim 1, wherein the values of the control voltage stored in the storing section are obtained based on a difference between a reference threshold voltage and at least one of the highest and lowest values of the threshold voltages extracted based on the threshold voltage distribution.

12. A non-volatile semiconductor memory device according to claim 11, wherein the value of the control voltage stored in the storing section contains a correction value obtained by considering variations in threshold voltage distribution from block to block contained in the chip.

13. A non-volatile semiconductor memory device according to claim 12, wherein the correction value further contains a value indicating a shift amount of the threshold voltage distribution after data writing and data erasing have been repeated alternately.

14. A non-volatile semiconductor memory device according to claim 1, wherein the threshold voltage distribution of the plurality of memory cell in each chip is measured by a wafer test.

15. A non-volatile semiconductor memory device according to claim 14, wherein in the wafer test, a single pulse of data writing voltage is applied to the plurality of memory cells.

16. A data writing control method, comprising the steps of:

applying a single pulse of data writing voltage to a plurality of memory cells contained in a chip;

extracting at least one of the highest and lowest threshold voltages based on a threshold voltage distribution of the plurality of memory cells; and calculating a control voltage to be applied to a control terminal of the memory cell, which permits the threshold voltage distribution to be within a predetermined range, based on at least one of the highest and lowest threshold voltages.

* * * * *